US009682544B2

(12) United States Patent
Kumakura et al.

(10) Patent No.: US 9,682,544 B2
(45) Date of Patent: Jun. 20, 2017

(54) PROCESSING APPARATUS AND PROCESSING METHOD OF STACK

(71) Applicant: Semiconductor Energy Laboratory Co., Ltd., Atsugi-shi, Kanagawa-ken (JP)

(72) Inventors: Kayo Kumakura, Tochigi (JP); Tomoya Aoyama, Atsugi (JP); Akihiro Chida, Isehara (JP); Kohei Yokoyama, Fujisawa (JP); Masakatsu Ohno, Tochigi (JP); Satoru Idojiri, Tochigi (JP); Hisao Ikeda, Zama (JP); Hiroki Adachi, Tochigi (JP); Yoshiharu Hirakata, Ebina (JP); Shingo Eguchi, Atsugi (JP); Yasuhiro Jinbo, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/147,020

(22) Filed: May 5, 2016

(65) Prior Publication Data
US 2016/0243812 A1    Aug. 25, 2016

Related U.S. Application Data

(63) Continuation of application No. 14/468,662, filed on Aug. 26, 2014, now Pat. No. 9,333,736.

(30) Foreign Application Priority Data

Aug. 30, 2013  (JP) .................................. 2013-179217
Aug. 30, 2013  (JP) .................................. 2013-179220
(Continued)

(51) Int. Cl.
*B32B 38/10*     (2006.01)
*B32B 43/00*     (2006.01)
(Continued)

(52) U.S. Cl.
CPC .............. *B32B 43/006* (2013.01); *B26D 1/04* (2013.01); *G02B 6/00* (2013.01);
(Continued)

(58) Field of Classification Search
CPC . B32B 38/10; B32B 43/006; Y10T 156/1126; Y10T 156/1132;
(Continued)

(56) References Cited

U.S. PATENT DOCUMENTS 6,227,276 B1   5/2001  Kim et al.
6,258,666 B1   7/2001  Mizutani et al.
(Continued)

FOREIGN PATENT DOCUMENTS

CN       101271869 A       9/2008
CN       102171745 A       8/2011
(Continued)

OTHER PUBLICATIONS

International Search Report (Application No. PCT/JP2014/071507) Dated Nov. 18, 2014.
(Continued)

*Primary Examiner* — Mark A Osele
*Assistant Examiner* — Nickolas Harm
(74) *Attorney, Agent, or Firm* — Robinson Intellectual Property Law Office; Eric J. Robinson

(57) ABSTRACT

A processing apparatus of a stack is provided. The stack includes two substrates attached to each other with a gap provided between their end portions. The processing apparatus includes a fixing mechanism that fixes part of the stack, a plurality of adsorption jigs that fix an outer peripheral edge of one of the substrates of the stack, and a wedge-shaped jig that is inserted into a corner of the stack. The plurality of adsorption jigs include a mechanism that allows the adsorption jigs to move separately in a vertical direction and a
(Continued)

US 9,682,544 B2

Page 2 horizontal direction. The processing apparatus further includes a sensor sensing a position of the gap between the end portion in the stack. A tip of the wedge-shaped jig moves along a chamfer formed on an end surface of the stack. The wedge-shaped jig is inserted into the gap between the end portions in the stack.

8 Claims, 30 Drawing Sheets

(30) Foreign Application Priority Data

Feb. 19, 2014 (JP) .................................. 2014-029422
Feb. 19, 2014 (JP) .................................. 2014-029423

(51) Int. Cl.
| | |
|---|---|
| *G02B 6/00* | (2006.01) |
| *H01L 21/67* | (2006.01) |
| *B26D 1/04* | (2006.01) |
| *H01L 51/56* | (2006.01) |
| *B26D 1/00* | (2006.01) |
| *H01L 27/12* | (2006.01) |
| *H01L 27/32* | (2006.01) |

(52) U.S. Cl.
CPC ........ *H01L 21/67092* (2013.01); *H01L 51/56* (2013.01); *B26D 2001/006* (2013.01); *B32B 38/10* (2013.01); *B32B 2457/00* (2013.01); *H01L 27/1248* (2013.01); *H01L 27/3258* (2013.01); *H01L 27/3262* (2013.01); *H01L 2221/68327* (2013.01); *H01L 2227/323* (2013.01); *H01L 2251/5338* (2013.01); *Y10T 156/1126* (2015.01); *Y10T 156/1132* (2015.01); *Y10T 156/1168* (2015.01); *Y10T 156/1184* (2015.01); *Y10T 156/1933* (2015.01); *Y10T 156/1944* (2015.01); *Y10T 156/1961* (2015.01); *Y10T 156/1967* (2015.01)

(58) Field of Classification Search
CPC ......... Y10T 156/1168; Y10T 156/1184; Y10T 156/1933; Y10T 156/1944; Y10T 156/1967

USPC ....... 156/706, 707, 714, 717, 756, 758, 762, 156/924
See application file for complete search history.

(56) References Cited

U.S. PATENT DOCUMENTS

| | | |
|---|---|---|
| 6,427,748 B1 | 8/2002 | Yanagita et al. |
| 7,182,234 B2 | 2/2007 | Rayssac et al. |
| 8,083,115 B2 | 12/2011 | Rayssac et al. |
| 8,360,129 B2 | 1/2013 | Ebata et al. |
| 8,367,440 B2 | 2/2013 | Takayama et al. |
| 8,415,208 B2 | 4/2013 | Takayama et al. |
| 2002/0029849 A1 | 3/2002 | Ohmi et al. |
| 2003/0047280 A1 | 3/2003 | Takayama et al. |
| 2004/0166653 A1 | 8/2004 | Kerdiles et al. |
| 2008/0233669 A1 | 9/2008 | Hirakata et al. |
| 2011/0198040 A1 | 8/2011 | Ebata et al. |
| 2011/0318906 A1 | 12/2011 | Chida et al. |
| 2012/0247685 A1 | 10/2012 | Burrows et al. |
| 2013/0062020 A1 | 3/2013 | Ries et al. |
| 2013/0178004 A1 | 7/2013 | Hirakata et al. |
| 2013/0214324 A1 | 8/2013 | Takayama et al. |
| 2015/0059986 A1 | 3/2015 | Komatsu et al. |
| 2015/0060933 A1 | 3/2015 | Ohno et al. |

FOREIGN PATENT DOCUMENTS

| | | |
|---|---|---|
| CN | 102202994 A | 9/2011 |
| JP | 2003-174153 A | 6/2003 |
| JP | 2005-089007 A | 4/2005 |
| JP | 2008-097829 A | 4/2008 |
| JP | 2009-023788 A | 2/2009 |
| JP | 2009-141070 A | 6/2009 |
| JP | 2009-224437 A | 10/2009 |
| JP | 2010-050313 A | 3/2010 |
| JP | 5360073 | 12/2013 |
| KR | 2011-0063800 A | 6/2011 |
| TW | 201039375 | 11/2010 |
| WO | WO-2010/090147 | 8/2010 |

OTHER PUBLICATIONS

Written Opinion (Application No. PCT/JP2014/071507) Dated Nov. 18, 2014.
Chinese Office Action (Application No. 201480047352.0), dated Jan. 3, 2017.

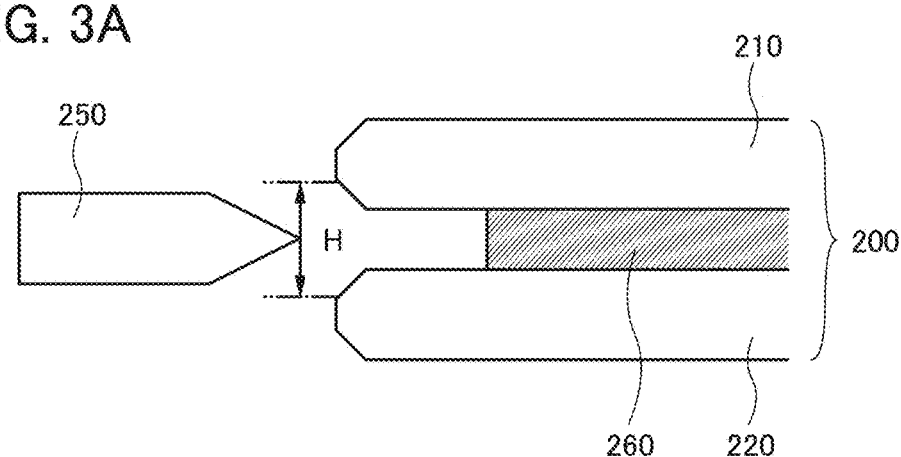
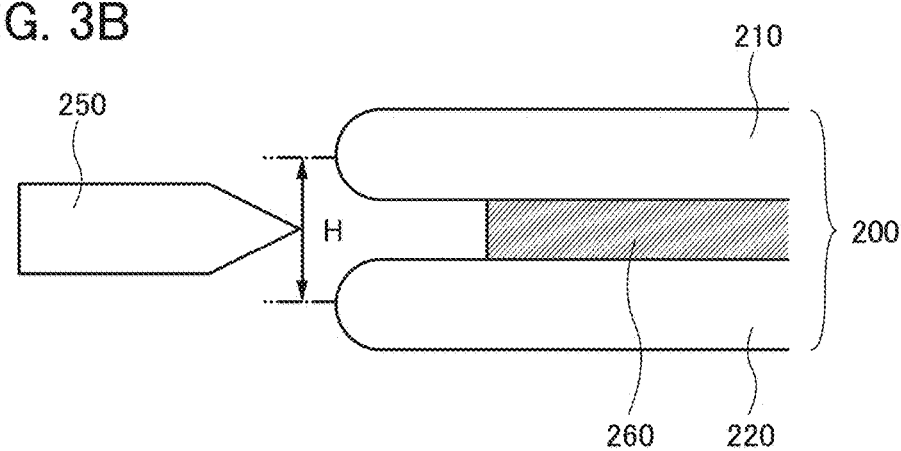
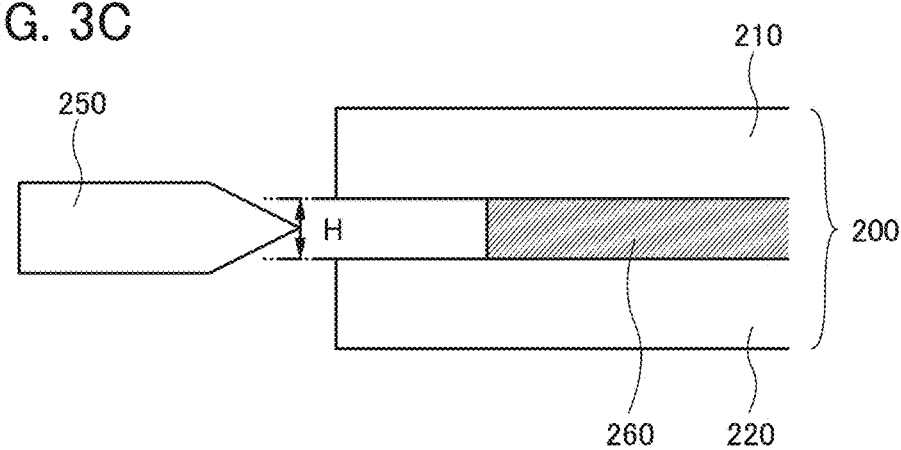

281

FIG. 12A1
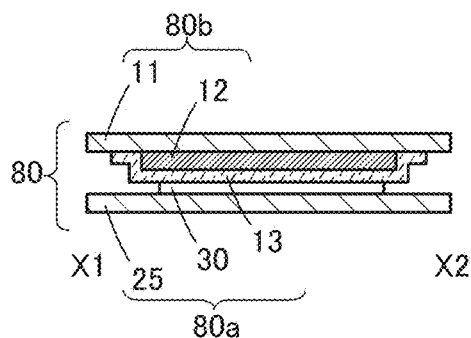
FIG. 12A2
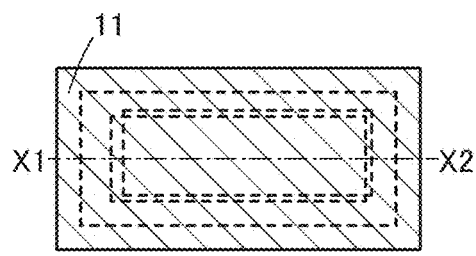
FIG. 12B1
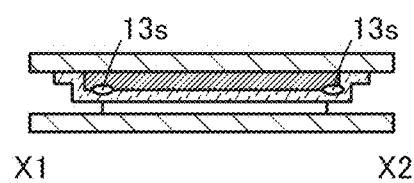
FIG. 12B2
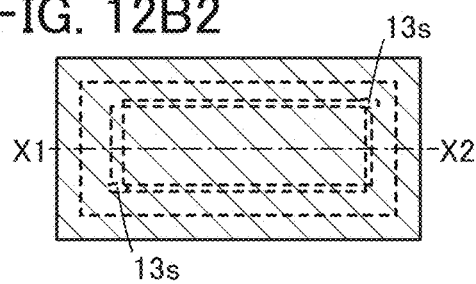
FIG. 12C
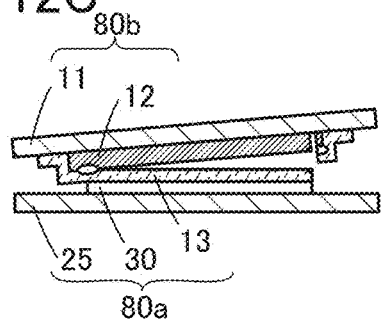
FIG. 12D1
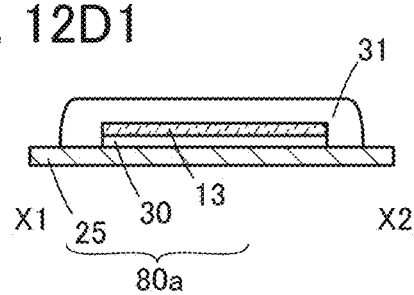
FIG. 12D2
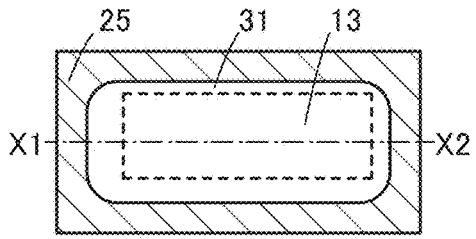
FIG. 12E1
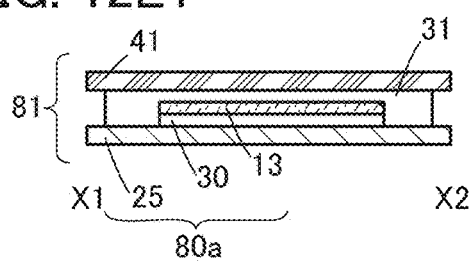
FIG. 12E2
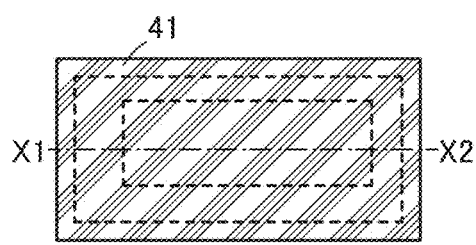

FIG. 14A1
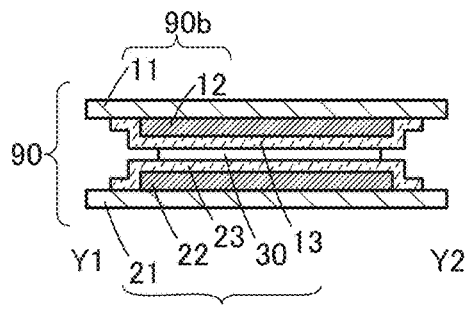
FIG. 14A2
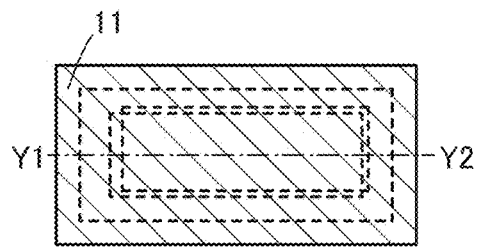
FIG. 14B1
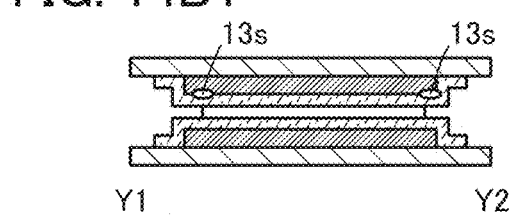
FIG. 14B2
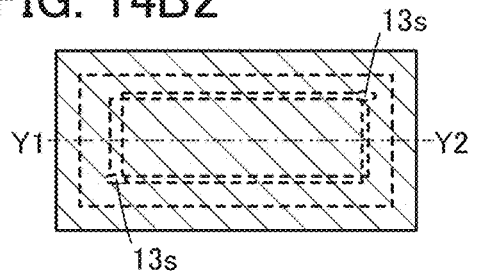
FIG. 14C
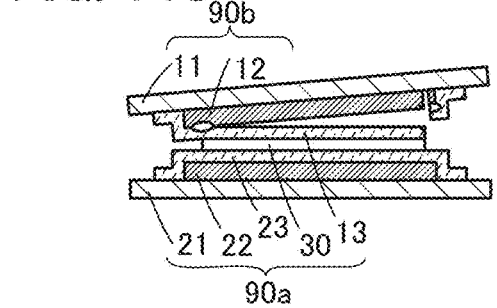
FIG. 14D1
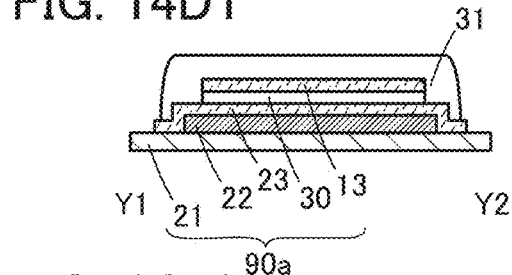
FIG. 14D2
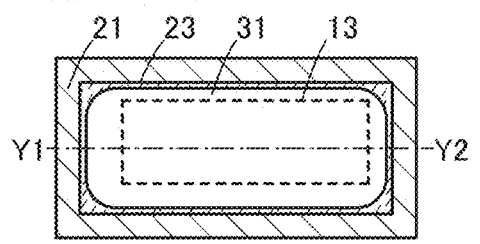
FIG. 14E1
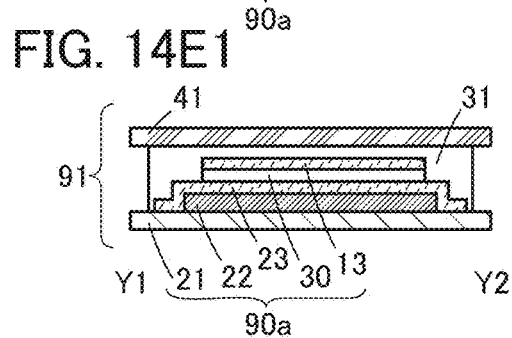
FIG. 14E2
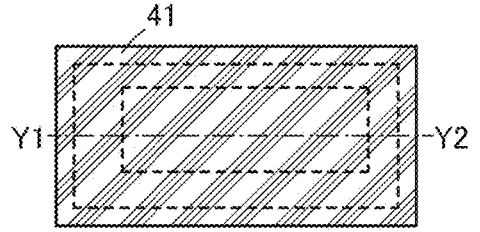

FIG. 15A1
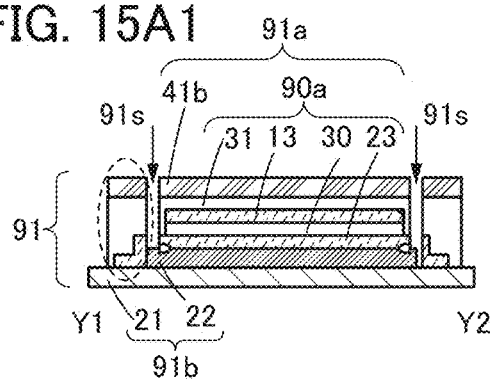
FIG. 15A2
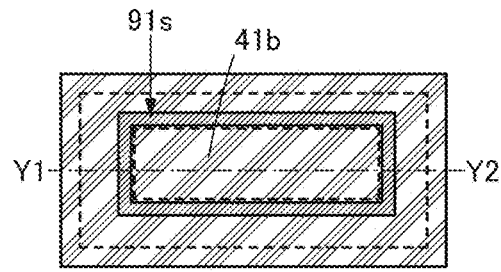
FIG. 15B
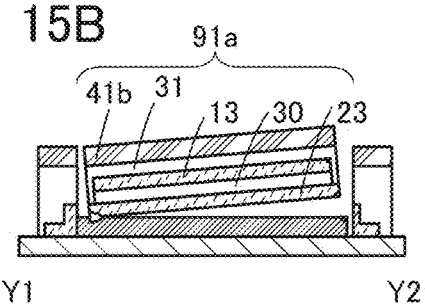
FIG. 15C
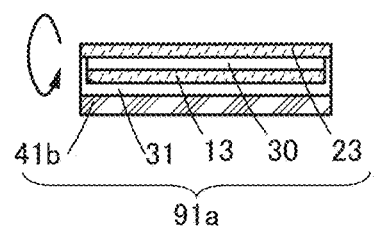
FIG. 15D1
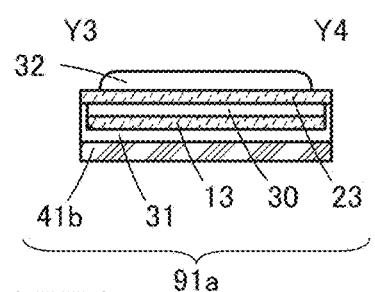
FIG. 15D2
FIG. 15E1
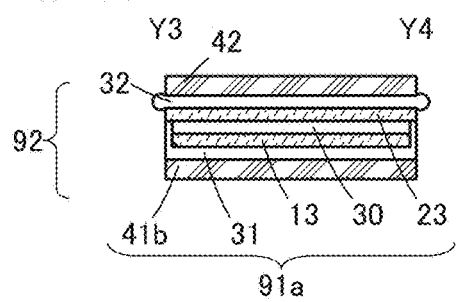
FIG. 15E2
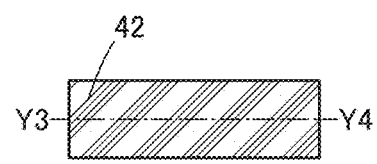

1000B

FIG. 17A1
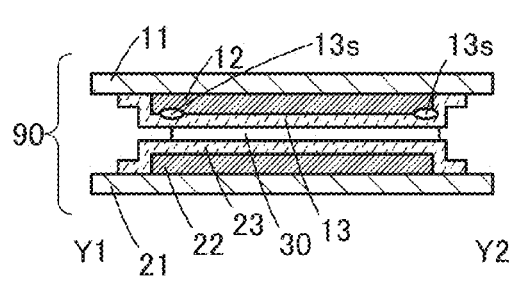
FIG. 17A2
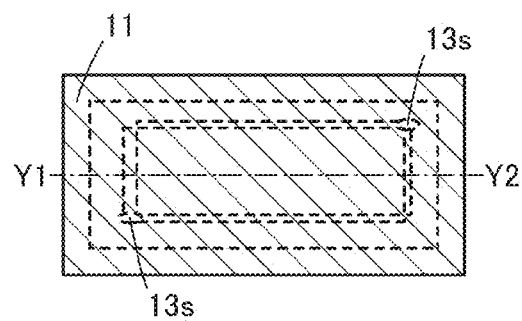

PROCESSING APPARATUS AND PROCESSING METHOD OF STACK

TECHNICAL FIELD

The present invention relates to an object, a method, or a manufacturing method. In addition, the present invention relates to a process, a machine, manufacture, or a composition of matter. In particular, the present invention relates to, for example, a semiconductor device, a display device, a light-emitting device, a power storage device, a processing device, a driving method thereof, or a manufacturing method thereof. In particular, one embodiment of the present invention relates to a method for processing a stack or a stack processing apparatus.

BACKGROUND ART

In recent years, research and development have been extensively conducted on light-emitting elements utilizing electroluminescence (EL). As a basic structure of these light-emitting elements, a layer containing a light-emitting substance is interposed between a pair of electrodes. Voltage is applied to this element to obtain light emission from the light-emitting substance.

The above light-emitting element is a self-luminous element; thus, a light-emitting device using the light-emitting element has advantages such as high visibility, no necessity of a backlight, and low power consumption. The light-emitting device using the light-emitting element also has advantages in that it can be manufactured to be thin and lightweight and has high response speed.

A light-emitting device including the above light-emitting element can have flexibility; therefore, the use of the light-emitting device for a flexible substrate has been proposed.

As a method for manufacturing a light-emitting device using a flexible substrate, a technology in which a separation layer is formed over a substrate, e.g., a glass substrate or a quartz substrate, a semiconductor element such as a thin film transistor is formed over the separation layer, and then, the semiconductor element is transferred to another substrate (e.g., a flexible substrate) has been developed (see Patent Document 1).

REFERENCE

Patent Document

[Patent Document 11] Japanese Published Patent Application No. 2003-174153

DISCLOSURE OF INVENTION

In the case of forming a light-emitting device or the like directly on a flexible substrate, the upper-limit temperature of a manufacturing process needs to be relatively low because a material for the flexible substrate has low heat resistance. For this reason, the quality of components of the light-emitting device might be reduced. Furthermore, in the case where alignment is performed in the manufacturing process, expansion and contraction of the flexible substrate due to heating in the manufacturing process might reduce yield.

For this reason, to reasonably perform various steps such as a heating step, an alignment step, and the like in a manufacturing process of a light-emitting device or the like using a flexible substrate, it is preferable that the steps be performed on a rigid substrate such as a glass substrate with heat resistance, and the light-emitting device or the like be transferred to the flexible substrate in the final stage of the manufacturing process.

In addition, depending on the kinds of light-emitting device or the like using a flexible substrate, the following manufacturing process can be used: thin components formed over two different rigid substrates are attached to each other, one of the rigid substrates is separated (first separation step) and a flexible substrate is attached, and the other of the rigid substrates is separated (second separation step) and a flexible substrate is attached. In this process, the first separation step requires a technique with great difficulty for separating the rigid substrates attached to each other with an extremely narrow gap.

Furthermore, to carry out the second separation step with high reproducibility, an external force applied to the flexible substrates needs to be adjusted with high accuracy. When the adjustment is inadequate, the component cannot be separated or the component is cut during the separation in some cases.

In view of the above, an object of one embodiment of the present invention is to provide a stack processing apparatus that inserts a wedge-shaped jig into a gap between two substrates attached to each other. Another object is to provide a stack processing apparatus that senses a gap between two substrates attached to each other. Another object is to provide a stack processing apparatus that separates one of two substrates attached to each other with a gap provided therebetween from the other of thereof. Another object is to provide a stack processing apparatus that separates a stack including a component formed over a substrate and a flexible substrate. Another object is to provide a stack processing apparatus that separates a stack including a component formed over a substrate and a flexible substrate with the use of jigs adsorbing part of the flexible substrate. Another object is to provide a stack processing apparatus that separates a stack including a component formed over a substrate and a flexible substrate with the use of jigs adsorbing part of the flexible substrate and a jig clamping and fixing part of the flexible substrate. Another object is to provide a stack processing apparatus in which one of two substrates attached to each other with a gap provided therebetween is separated from the other thereof, and a flexible substrate is attached to a remaining portion. Another object is to provide a stack processing apparatus in which one of two substrates attached to each other with a gap provided therebetween is separated from the other thereof to form a first remaining portion, a first flexible substrate is attached to the first remaining portion, the other of the substrates is separated to form a second remaining portion, and a second flexible substrate is attached to the second remaining portion. Another object is to provide a novel stack processing apparatus. Another object is to provide a novel manufacturing apparatus. The other object is to provide a method for processing a stack with the use of any of the above stack processing apparatuses or the manufacturing apparatus.

Note that the descriptions of these objects do not disturb the existence of other objects. In one embodiment of the present invention, there is no need to achieve all the objects. Other objects will be apparent from and can be derived from the description of the specification, the drawings, the claims, and the like.

The present invention relates to a stack processing apparatus.

One embodiment of the present invention is a processing apparatus of a stack including two substrates attached to each other with a gap provided between their end portions. The processing apparatus of the stack includes a fixing mechanism that fixes part of the stack, a plurality of adsorption jigs that fix an outer peripheral edge of one of the substrates of the stack, and a wedge-shaped jig that is inserted into a corner of the stack. The plurality of adsorption jigs include a mechanism that allows the adsorption jigs to move separately in a vertical direction and a horizontal direction.

The processing apparatus of the stack preferably includes a sensor sensing the position of the gaps between the end portions in the stack.

A structure may be employed in which a tip of the wedge-shaped jig moves along a chamfer formed on an end surface of the stack, and the wedge-shaped jig is inserted into the gap between the end portions in the stack.

The processing apparatus of the stack preferably includes a nozzle for injecting liquid to the stack.

The processing apparatus of the stack may include a roller in contact with the one of the substrates of the stack.

Another embodiment of the present invention is a processing apparatus of a stack including a flexible substrate. The processing apparatus of the stack includes a fixing mechanism that fixes part of the stack, a plurality of adsorption jigs that fix an outer peripheral edge of the flexible substrate, and a plurality of clamp jigs that fix part of the flexible substrate of the stack. The plurality of adsorption jigs and the plurality of clamp jigs each include a mechanism that allows the plurality of adsorption jigs or the plurality of clamp jigs to move separately in a vertical direction and a horizontal direction.

The processing apparatus of the stack preferably includes a nozzle for injecting liquid to the stack.

It is preferable that the plurality of clamp jigs include a first clamp jig and a second clamp jig, and the first clamp jig and the second clamp jig each include a mechanism that allows a movement in a direction in which the fixed flexible substrate is expanded.

Another embodiment of the present invention is a processing apparatus of a first stack including two substrates attached to each other with gaps provided between their end portions. The processing apparatus includes a loader unit that feeds the first stack, a support feeding unit that feeds a support, a separating unit that separates one of the substrates of the first stack to form a remaining portion, an attaching unit that attaches the support to the remaining portion with the use of an adhesive layer, and an unloader unit that transports a second stack including the remaining portion and the support attached to each other with the adhesive layer. The separating unit includes a fixing mechanism that fixes part of the first stack, a plurality of adsorption jigs that fix an outer peripheral edge of the one of the substrates of the first stack, and a wedge-shaped jig inserted into a corner of the first stack. The plurality of adsorption jigs include a mechanism that allows the adsorption jigs to move separately in a vertical direction and a horizontal direction.

Note that in this specification and the like, ordinal numbers such as "first" and "second" are used in order to avoid confusion among components and do not limit the components numerically.

Another embodiment of the present invention is a processing apparatus of a first stack including two substrates attached to each other with gaps provided between their end portions. The processing apparatus includes a first loader unit that feeds the first stack, a support feeding unit that feeds a first support and a second support, a first separating unit that separates one of the substrates of the first stack to form a first remaining portion, a first attaching unit that attaches the first support to the first remaining portion with the use of a first adhesive layer, a first unloader unit that transports a second stack including the first remaining portion and the first support attached to each other with the first adhesive layer, a second loader unit that feeds the second stack, a starting point forming unit that forms a separation starting point in the vicinities of end portions of the first remaining portion and the first support, a second separating unit that separates the other of the substrates of the second stack to form a second remaining portion, a second attaching unit that attaches the second support to the second remaining portion with the use of a second adhesive layer, and a second unloader unit that transports a third stack including the second remaining portion and the second support attached to each other with the second adhesive layer. The first separating unit includes a fixing mechanism that fixes part of the first stack, a plurality of adsorption jigs that fix an outer peripheral edge of the one of the substrates of the first stack, and a wedge-shaped jig inserted into a corner of the first stack. The plurality of adsorption jigs include a mechanism that allows the adsorption jigs to move separately in a vertical direction and a horizontal direction. The second separating unit includes a fixing mechanism that fixes the other of the substrates of the second stack, a plurality of adsorption jigs that fix an outer peripheral edge of the first support of the second stack, and a plurality of clamp jigs that fix part of the first support of the second stack. The plurality of adsorption jigs and the plurality of clamp jigs each include a mechanism that allows the plurality of adsorption jigs or the plurality of clamp jigs to move separately in the vertical direction and the horizontal direction.

Another embodiment of the present invention is a method for processing a stack including two substrates attached to each other with gaps provided between their end portions that includes the following steps: fixing part of the stack to a fixing mechanism; moving a plurality of adsorption jigs to fix an outer peripheral edge of the one of the substrates of the stack with the plurality of adsorption jigs; injecting a wedge-shaped jig into a corner of the stack; moving upward the adsorption jig that is closest to the corner among the plurality of adsorption jigs to start separation of the one of the substrates of the stack; and selectively moving the adsorption jigs sequentially so that the separated region is increased from a starting point of the separation.

The other embodiment of the present invention is a method for processing a stack including a flexible substrate that includes the following steps: fixing part of the stack to a fixing mechanism; moving a plurality of adsorption jigs to fix an outer peripheral edge of the flexible substrate of the stack with the plurality of adsorption jigs; moving some of the adsorption jigs to separate part of the flexible substrate of the stack; fixing a plurality of clamp jigs to part of the separated region; and moving the adsorption jigs and the clamp jigs to carry on separation of the flexible substrate of the stack.

One embodiment of the present invention makes it possible to provide a stack processing apparatus that inserts a wedge-shaped jig into a gap between two substrates attached to each other. It is possible to provide a stack processing apparatus that senses a gap between two substrates attached to each other. It is possible to provide a stack processing apparatus that separates one substrate from the other substrate when the substrates are attached to each other with a gap provided therebetween. It is possible to provide a stack processing apparatus that separates a stack including a component formed over a substrate and a flexible substrate. It is possible to provide a stack processing apparatus that separates a stack including a component formed over a substrate and a flexible substrate with the use of jigs adsorbing part of the flexible substrate. It is possible to provide a stack processing apparatus that separates a stack including a component formed over a substrate and a flexible substrate with the use of jigs adsorbing part of the flexible substrate and a jig clamping and fixing part of the flexible substrate. It is possible to provide a processing apparatus in which one of two substrates attached to each other with a gap provided therebetween is separated from the other thereof, and a flexible substrate is attached to a remaining portion. It is possible to provide a stack processing apparatus in which one of two substrates attached to each other with a gap provided therebetween is separated from the other thereof to form a first remaining portion, a first flexible substrate is attached to the first remaining portion, the other of the substrates is separated to form a second remaining portion, and a second flexible substrate is attached to the second remaining portion. It is possible to provide a novel stack processing apparatus. It is possible to provide a novel manufacturing apparatus. It is possible to provide a method for processing a stack with the use of any of the above stack processing apparatuses or the manufacturing apparatus.

Note that the description of these effects does not disturb the existence of other effects. One embodiment of the present invention does not necessarily achieve all the objects listed above. Other effects will be apparent from and can be derived from the description of the specification, the drawings, the claims, and the like.

BRIEF DESCRIPTION OF DRAWINGS

FIGS. 3A to 3C each illustrate a state before insertion of a wedge-shaped jig into a processed member.
FIGS. 12A-1, 12A-2, 12B-1, 12B-2, 12C, 12D-1, 12D-2, 12E-1, and 12E-2 illustrate a manufacturing process of a stack.
FIGS. 14A-1, 14A-2, 14B-1, 14B-2, 14C, 14D-1, 14D-2, 14E-1, and 14E-2 illustrate a manufacturing process of a stack.
FIGS. 15A-1, 15A-2, 15B, 15C. 15D-1, 15D-2, 15E-1, and 15E-2 illustrate a manufacturing process of a stack.
FIGS. 17A-1 and 17A-2 illustrate a processed member panel.

BEST MODE FOR CARRYING OUT THE INVENTION

Figure 1:
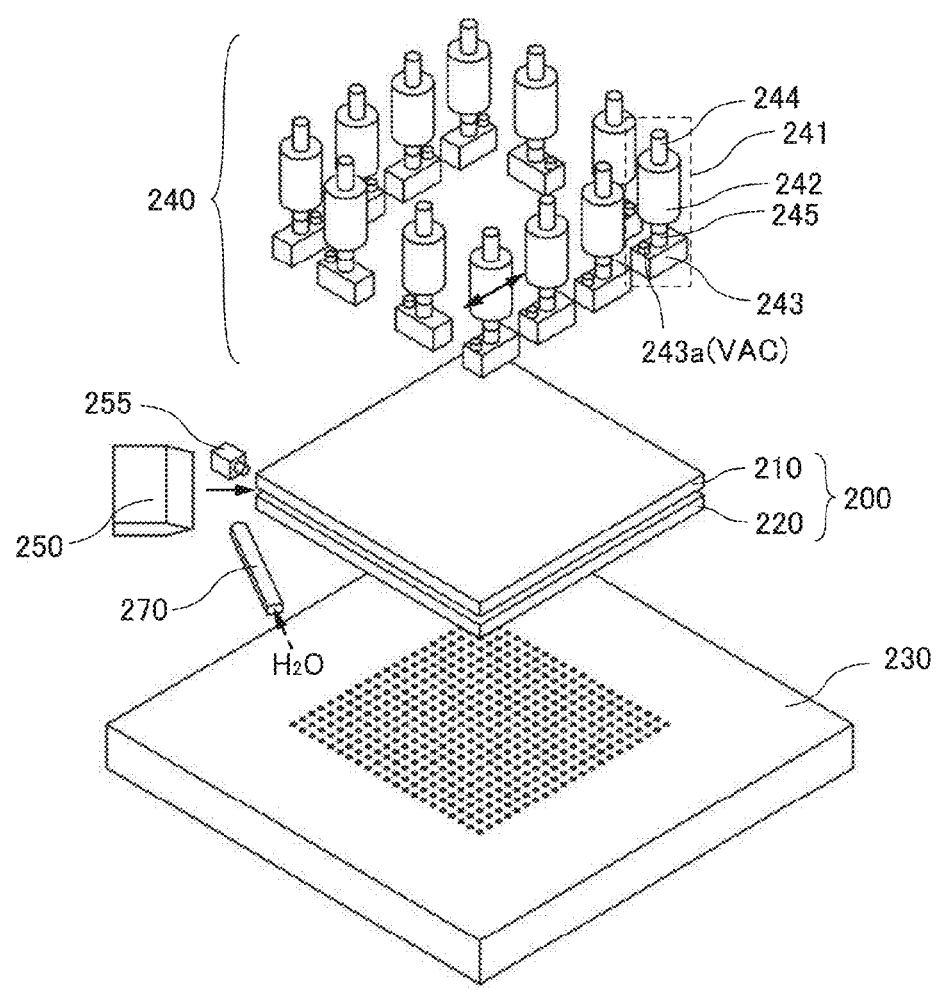
FIG. 1 illustrates a stack processing apparatus.

Embodiments will be described in detail with reference to drawings. Note that the present invention is not limited to the following description and it will be readily appreciated by those skilled in the art that modes and details can be modified in various ways without departing from the spirit and the scope of the present invention. Therefore, the present invention should not be interpreted as being limited to the description of embodiments below. Note that in structures of the present invention described below, the same portions or portions having similar functions are denoted by the same reference numerals in different drawings, and description thereof is not repeated in some cases.

(Embodiment 1)

In this embodiment, a stack processing apparatus that is one embodiment of the present invention is described. Note that there is no particular limitation on the usage of the stack processing apparatus. The stack processing apparatus is particularly useful in a manufacturing process of a semiconductor device, a display device, a light-emitting device, a power storage device, a power generation device, or the like that includes a flexible substrate.

One embodiment of the present invention can be used in a step of transferring a component formed over a substrate to a flexible substrate. For example, one embodiment of the present invention is used in steps of attaching thin components formed over two substrates and then separating one of the substrates. Although it is preferable to use a rigid substrate such as a glass substrate as the substrate, it is also possible to use a flexible substrate such as a resin substrate.

FIG. 1 is a perspective view of a stack processing apparatus that is one embodiment of the present invention. The processing apparatus includes a fixing stage 230 to which a processed member 200 is fixed, an adsorption mechanism 240, and a wedge-shaped jig 250. Note that detail such as power mechanism of each component is not illustrated in FIG. 1. In addition, a camera or the like may be provided to monitor and control the steps.

The processed member 200 that is processed by the processing apparatus can be a member including a substrate 210, a substrate 220, and a thin component (not illustrated in FIG. 1) provided between the two substrates. Examples of the substrates 210 and 220 include a glass substrate, and examples of a component provided between the glass substrates include components of a light-emitting device and the like.

Note that when the substrate 210 is a substrate to be separated, a separation layer is preferably formed between the substrate 210 and the component to facilitate a separation step. In the separation step, the separation layer remains on the substrate 210 side, and may also remain on the component side in some cases. It is preferable that a region to be a separation starting point be formed in part of the separation layer or part of the component on the separation layer. Note that the region to be the separation starting point can be formed by a physical means such as a knife, laser processing, or the like.

As the fixing stage 230 to which the processed member 200 is fixed, for example, a vacuum adsorption stage, an electrostatic adsorption stage, or the like can be used. Alternatively, the processed member 200 may be fixed to the stage with a screwing jig or the like. At this time, the processed member 200 is aligned and fixed in a predetermined position.

Figure 26:
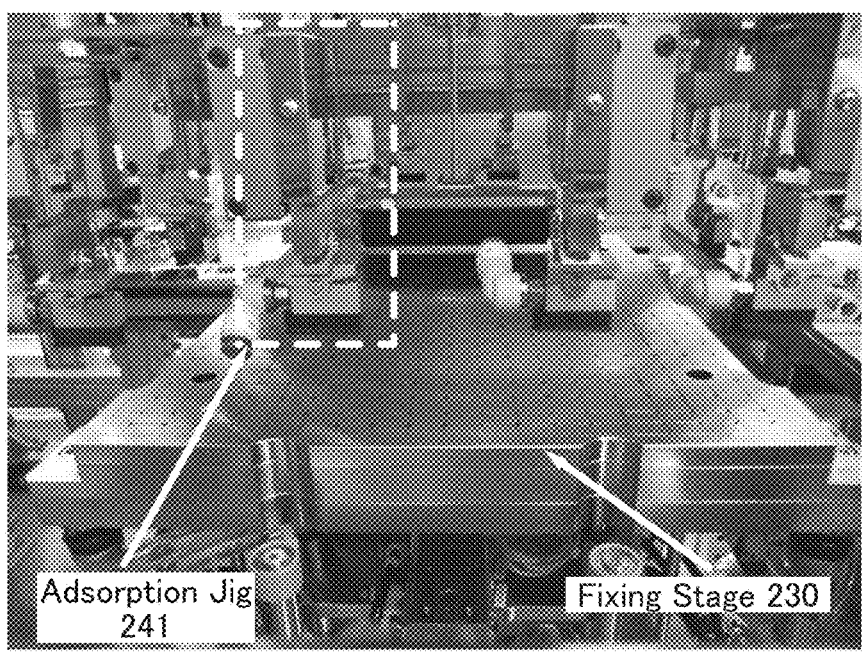
FIG. 26 is a photograph of a stack processing apparatus.

The adsorption mechanism 240 includes a plurality of adsorption jigs 241. The adsorption jigs are placed to fix the vicinity of the rim of a first plane (the substrate 210 in FIG. 1) of the processed member 200. The adsorption jigs 241 each include a vertical movement mechanism 242 and an adsorption portion 243. The vertical movement mechanisms 242 are included in the adsorption jigs 241 to independently control the vertical movements of the adsorption portions 243. The adsorption portions 243 each have an inlet 243a connected to a vacuum pump or the like, and perform vacuum adsorption of the processed member 200. A movable portion 245 is provided between an axis 244 of the vertical movement mechanism 242 and the adsorption portion 243. The adsorption jig 241 includes a means for movement in the horizontal direction indicated by a double-headed arrow. Thus, the substrate 210 can be kept adsorbed even when the substrate 210 is deformed or its position is changed in the separation step. Note that the movable portion 245 may be formed using a mechanical mechanism including a joint or a material with elasticity such as a rubber or a spring. Although FIG. 1 illustrates the adsorption mechanism 240 including the twelve adsorption jigs, the structure is not limited thereto. The number of adsorption jigs 241, the size of the adsorption portion 243, and the like may be determined depending on the size and the physical property of the processed member 200. FIG. 26 is a photograph of the stack processing apparatus of one embodiment of the present invention that includes the fixing stage 230 and the adsorption jigs 241.

As the wedge-shaped jig 250, a blade jig can be used. Here, the wedge-shaped jig 250 pushes the attached substrates 210 and 220 apart by being inserted into an extremely narrow gap between the substrates 210 and 220. For this reason, it is preferable that the thickness of the pointed tip of the wedge-shaped jig 250 be smaller than the gap and the thickness of a plate-like portion of the wedge-shaped jig 250 be larger than the gap. A sensor 255 that senses an inserted position of the wedge-shaped jig 250 may be included. Note that the term "gap" in this embodiment refers to a region in which the component is not provided between the substrate 210 and the substrate 220, and mainly refers to a region of outer edges of the substrates.

Furthermore, a nozzle 270 to which liquid is supplied is preferably provided in the vicinity of the position of the processed member 200 where the wedge-shaped jig 250 is inserted. As the liquid, water can be used, for example. When water exists in a portion where the separation is in process, separation strength can be decreased. Moreover, electrostatic discharge damage to an electronic device or the like can be prevented. As the liquid, an organic solvent or the like can be used instead of water; for example, a neutral, alkaline, or acid aqueous solution may be used.

Figure 2:
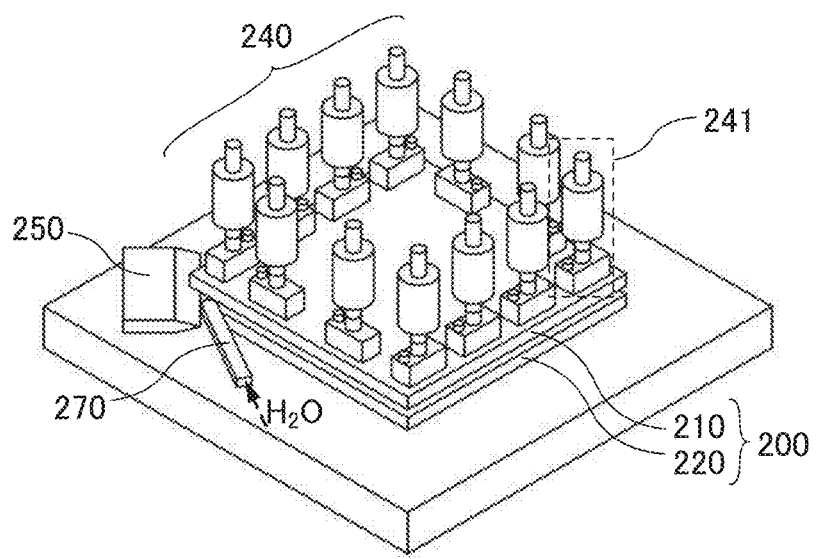
FIG. 2 illustrates a stack processing apparatus.

FIG. 2 illustrates a perspective view of a state in which a side of the processed member 200 that is not separated (the substrate 220) is fixed to the fixing stage 230, the plurality of adsorption jigs 241 included in the adsorption mechanism 240 are adsorbed onto a separated side of the processed member 200 (the substrate 210), and the wedge-shaped jig 250 is inserted into a gap in the processed member 200.

Here, a state before the wedge-shaped jig 250 is inserted into the gap in the processed member 200 is illustrated in cross-sectional views of FIGS. 3A to 3C. In FIGS. 3A to 3C, a component 260 provided between the substrates 210 and 220 has extremely small thickness, and thus the processed member 200 has an extremely narrow gap. Given that the component 260 is a component of a light-emitting device, the gap is approximately 10 µm to 15 µm, and it is very difficult to fix the position of the wedge-shaped jig 250 and insert the wedge-shaped jig 250 into the gap. Therefore, it is preferable that the position of the gap or the thickness of the substrate be sensed with the use of the sensor 255 (e.g., an optical sensor, a displacement sensor, or a camera) illustrated in FIG. 1, and then the wedge-shaped jig 250 be inserted into the gap.

In addition, it is preferable that a structure in which the wedge-shaped jig 250 can move in the thickness direction of the processed member 200 be employed and a substrate whose end portions are chamfered be used for the processed member 200. Thus, it is possible to include chamfers in an area to which the wedge-shaped jig 250 can be inserted, and the area including the chamfers on the gap side is sensed with the sensor 255.

FIG. 3A illustrates the cross-sectional view of the substrates subjected to C chamfering. When the tip of the wedge-shaped jig 250 is inserted toward a C chamfer, the tip of the wedge-shaped jig 250 slides along the C chamfer and is guided to the gap. Thus, it is possible to increase an area H to which the wedge-shaped jig 250 can be inserted.

FIG. 3B illustrates the cross-sectional view of the substrates subjected to R chamfering. When the tip of the wedge-shaped jig 250 is inserted toward an R chamfer, the tip of the wedge-shaped jig 250 slides along the R chamfer and is guided to the gap. Thus, the area H in the case of the R chamfering in FIG. 3B can be larger than that in the case of the C chamfering in FIG. 3A.

FIG. 3C illustrates the cross-sectional view of the substrates that are not subjected to chamfering, which indicates that the area H is very small. In FIG. 3C, when the wedge-shaped jig 250 moves toward outside the area H, the processed member 200 might be broken, which reduces the yield in a process. In addition, an adverse effect is exerted in the case of reusing the substrates 210 and 220 used in the processed member 200. In view of the above, the substrates whose end portions are chamfered are preferably used in the processed member 200 as illustrated in FIGS. 3A and 3B.

As illustrated in FIG. 2, when the wedge-shaped jig 250 is inserted into a gap in a corner of the processed member 200 to push the attached substrates 210 and 220 apart, separation starts in the region to be the separation starting point that is formed in advance. At this time, water is preferably supplied to the portion where the separation is in process as described above.

Note that in a separation step described in the following process, the separation is preferably performed successively without being stopped, and is more preferably performed with constant velocity. When the separation is stopped in the middle and then started in the same region, distortion or the like occurs in the region, which does not occur in the case where the separation is successively performed. Thus, a minute structure of the region and the characteristics of an electronic device in the region are changed, which might influence display of a display device, for example.

Therefore, in the step of carrying on the separation by inserting the wedge-shaped jig 250, the separation is preferably stopped in a predetermined region in the component 260 so as not to cause a defective product. For example, in the case of a display device, separation may be stopped before it reaches a region where a pixel and a driver circuit are provided.

Figure 4A:
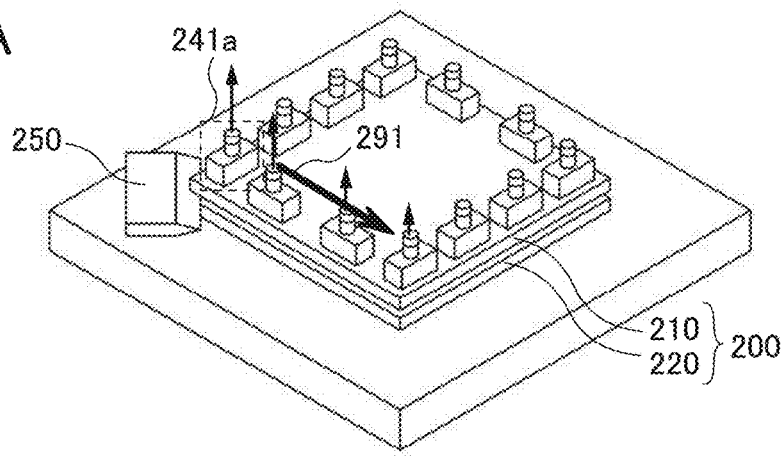
FIGS. 4A to 4C illustrate a separation step performed with a stack processing apparatus.

An example of the separation step is described with reference to FIGS. 4A to 4C. Note that some of the components illustrated in FIG. 2 are omitted in FIGS. 4A to 4C for simplicity. An arrow illustrated with each adsorption jig schematically illustrates the move distance in the upward direction of the adsorption portion 243 which is included in each adsorption jig, or strength required of lifting the adsorption portion 243 upward.

After the wedge-shaped jig 250 is inserted into the gap in the corner of the processed member 200 and the separation starts, the adsorption portion 243 included in the adsorption jig 241a which is closest to the corner is moved slowly. Then, the adsorption portions 243 included in the corresponding adsorption jigs are moved sequentially so that the separation is carried on in a direction 291 indicated by an arrow in FIG. 4A; thus, one side of the processed member 200 is separated.

Figure 4B:
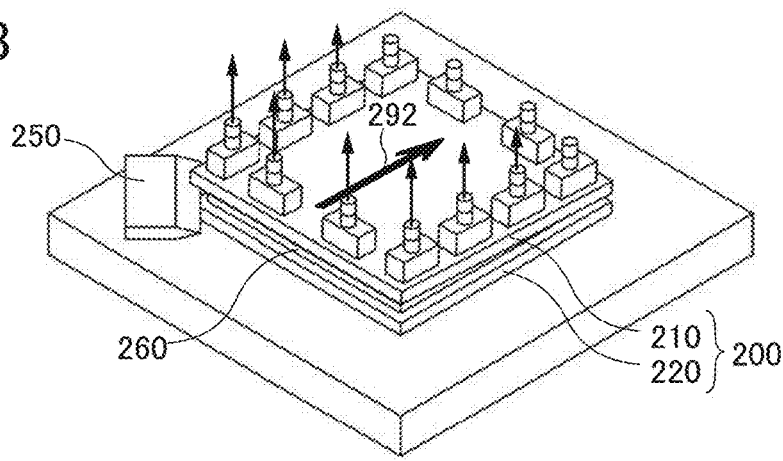
Figure 4C:
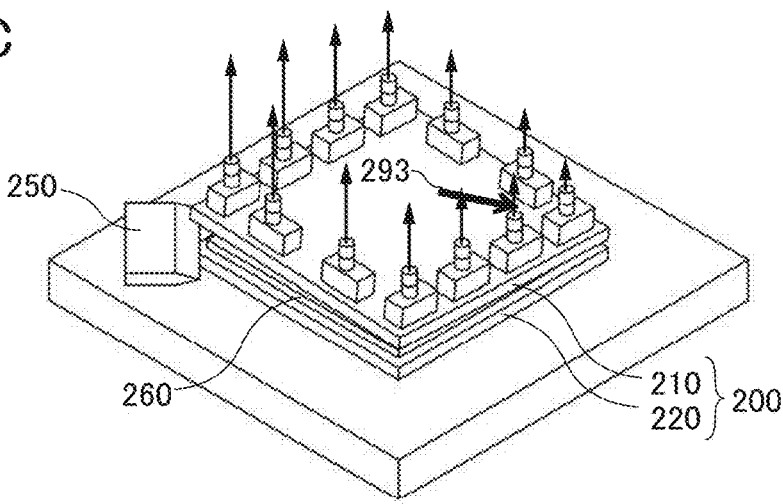

Next, as illustrated in FIG. 4B, the adsorption portions 243 included in the corresponding adsorption jigs are moved sequentially so that the separation is carried on from the separated side of the processed member 200 in a direction 292 indicated by an arrow:

Then, as illustrated in FIG. 4C, the adsorption portions 243 included in the corresponding adsorption jigs are moved sequentially so that a position on the diagonal line of the corner of the processed member 200 to which the wedge-shaped jig 250 is inserted becomes a separation end point; thus, the separation is carried on in a direction 293 indicated by an arrow.

Note that in the separation step, the separation rate is preferably managed. When the movement of the adsorption portions 243 of the adsorption jigs is fast and the separation cannot follow the movement, the separated portion is cut. For this reason, it is preferable that the angle between the substrates 210 and 220 in the separation, tractive force in the movement of the adsorption portions 243 included in the adsorption jigs, and the like be managed with the use of image processing, a displacement sensor, a pull gauge, or the like to prevent the separation rate from being excessively high.

Figure 5:
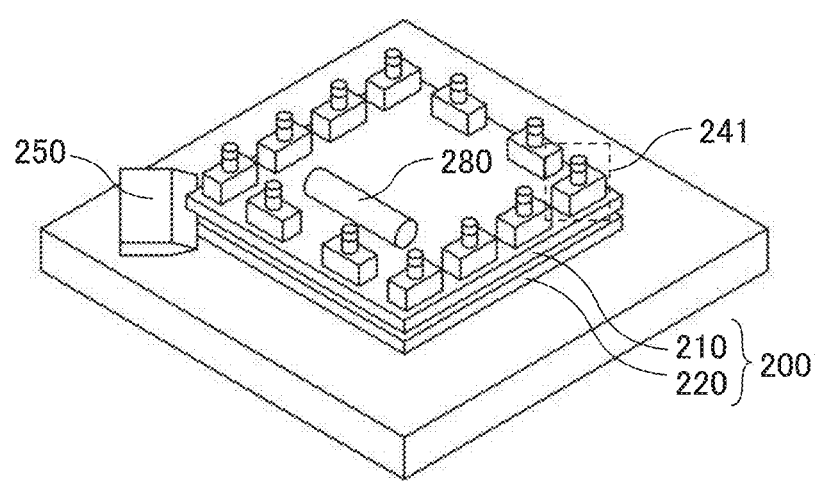
FIG. 5 illustrates a stack processing apparatus that includes a roller.

The stack processing apparatus that is one embodiment of the present invention may include a roller 280 as illustrated in FIG. 5. When it is difficult to adjust the separating position or the separation rate only by the adsorption jigs 241, the use of the roller can facilitate the adjustment.

In addition, to remove water or the like that remains after the separation step, a dryer or the like may be provided. Water can be removed by spraying a gas such as the air or a $N_2$ gas to the substrate, for example.

With the use of the stack processing apparatus that is one embodiment of the present invention in the above manner, a crack in the substrate, cutting of the separated portion, and the like are less likely to occur and the separation step of the processed member 200 can be performed with a high yield.

This embodiment can be combined with any of the other embodiments in this specification as appropriate.

(Embodiment 2)

In this embodiment, a different mode of the stack processing apparatus that is one embodiment of the present invention from Embodiment 1 is described. Note that there is no particular limitation on the usage of the processing apparatus. It is useful to use the processing apparatus in manufacturing process of, in particular, a semiconductor device with a flexible substrate, a display device, a light-emitting device, a power storage device, a power generation device, or the like.

One embodiment of the present invention can be used in a step of transferring a component formed over a substrate to a flexible substrate. For example, in the case of a stack in which a component and a flexible substrate are stacked in this order over a substrate, one embodiment of the present invention is used in a step of separating the component and the flexible substrate from the substrate. Although it is preferable to use a rigid substrate such as a glass substrate as the substrate, it is also possible to use a flexible substrate such as a resin substrate.

Figure 6:
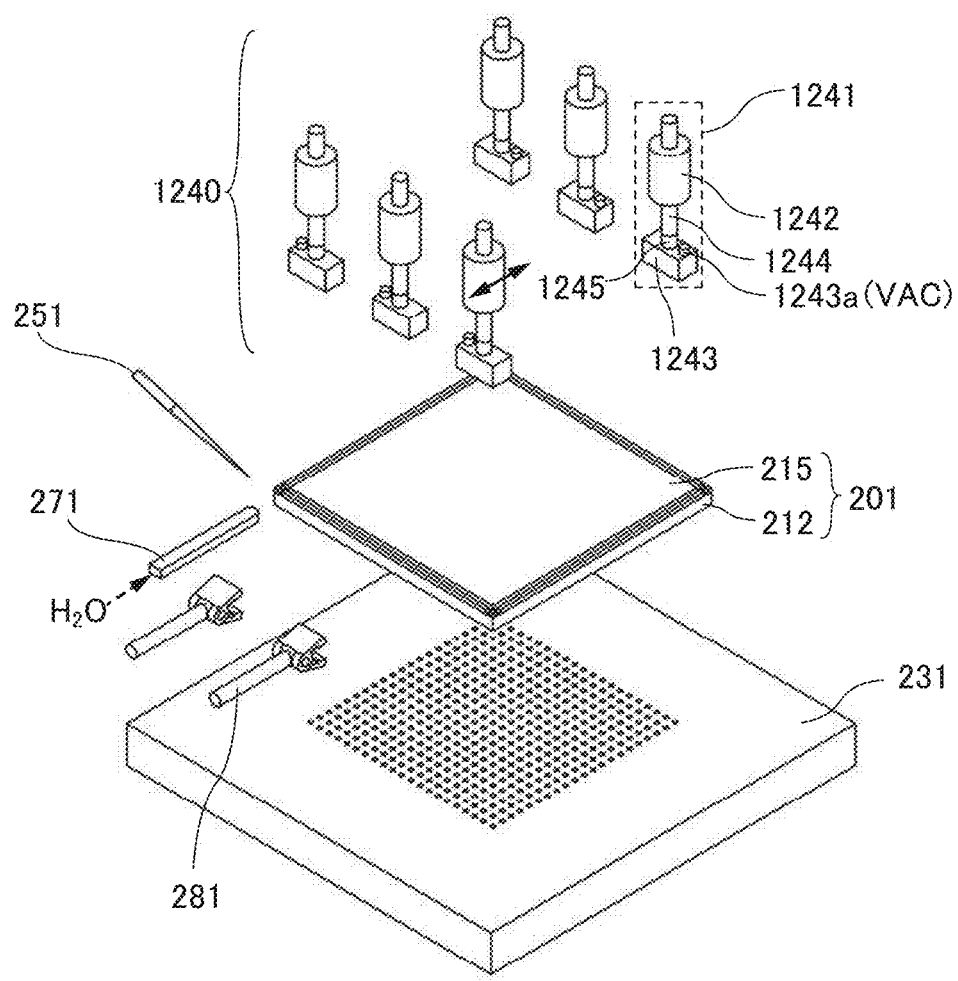
FIG. 6 illustrates a stack processing apparatus.

FIG. 6 is a perspective view of a stack processing apparatus that is one embodiment of the present invention. The processing apparatus includes a fixing stage 231 to which a processed member 201 is fixed, an adsorption mechanism 1240, and clamp jigs 281. Note that detail such as power mechanism of each component is not illustrated in FIG. 6. In addition, a camera or the like may be provided to monitor and control the steps.

The processed member 201 that is processed by the processing apparatus can be a member including a flexible substrate 215, a substrate 212, and a thin component (not illustrated in FIG. 6) provided between the flexible substrate 215 and the substrate 212. Examples of the component provided between the flexible substrate 215 and the substrate 212 include components and the like of a light-emitting device.

Figure 7:
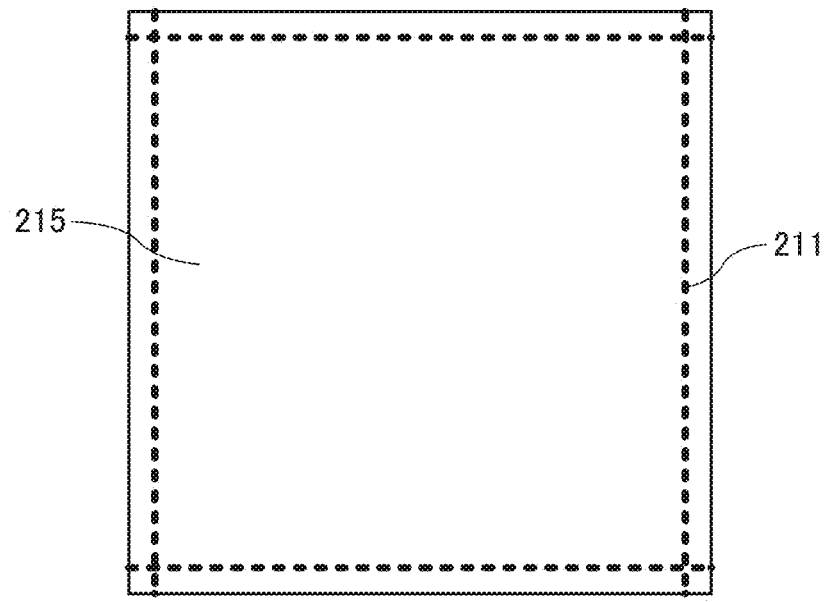
FIG. 7 illustrates a separation starting point formed in a processed member.

Note that when the flexible substrate 215 and the component are separated, a separation layer is preferably formed between the component and the substrate 212 to facilitate a separation step. In the separation step, the separation layer remains on the substrate 212 side, and may also remain on the component side in some cases. It is preferable that a region to be a separation starting point be formed in part of the component on the separation layer and part of the flexible substrate 215. The region is formed by making a slit 211 in the flexible substrate 215 and the component as illustrated in a top view of FIG. 7. The slit reaches the separation layer to form the separation starting point, so that a region surrounded by the slit is separated. Note that the slit 211 can be made with a physical means such as a knife, laser processing, or the like.

As the fixing stage 231 to which the processed member 201 is fixed, for example, a vacuum adsorption stage, an electrostatic adsorption stage, or the like can be used. Alternatively, the processed member 201 may be fixed to the stage with a screwing jig or the like. At this time, the processed member 201 is aligned and fixed in a predetermined position.

The adsorption mechanism 1240 includes a plurality of adsorption jigs 1241. The adsorption jigs are placed to fix the vicinity of the rim of a first plane (the flexible substrate 215 in FIG. 6) of the processed member 201. The adsorption jigs 1241 each include a vertical movement mechanism 1242 and an adsorption portion 1243. The vertical movement mechanisms 1242 are included in the adsorption jigs 1241 to independently control the vertical movements of the adsorption portions 1243. The adsorption portions 1243 each have an inlet 1243*a* connected to a vacuum pump or the like, and perform vacuum adsorption of the processed member 201. A movable portion 1245 is provided between an axis 1244 of the vertical movement mechanism 1242 and the adsorption portion 1243. The adsorption jig 1241 includes a means for movement in the horizontal direction indicated by a double-headed arrow. Thus, the flexible substrate 215 can be kept adsorbed even when the flexible substrate 215 is deformed or its position is changed in the separation step. Note that the movable portion 1245 may be formed using a mechanical mechanism including a joint or a material with elasticity such as a rubber or a spring. Although FIG. 6 illustrates the adsorption mechanism 1240 including the six adsorption jigs, the structure is not limited thereto. The number of adsorption jigs 1241, the size of the adsorption portion 1243, and the like may be determined depending on the size and the physical property of the processed member 201.

As a needle 251, a rigid protrusion can be used. For example, the needle 251 is inserted into a corner of the slit 211 that is to be the separation starting point illustrated in FIG. 7, and is pressed onto the flexible substrate 215 and slides or is operated so as to turn over the flexible substrate 215. Thus, the separation is partly carried on, which facilitates the subsequent step. Note that the insertion position of the needle 251 can be sensed with image processing, a displacement sensor, or the like. In the case where a needed amount of separated area is obtained at the time of making the slit 211 or in other steps, the step of using the needle does not need to be performed. In this case, the needle 251 can be omitted in the structure of the stack processing apparatus that is one embodiment of the present invention.

Furthermore, a nozzle 271 to which liquid is supplied is preferably provided in a corner of the processed member 201 or in the vicinity of the position where the separation starts. As the liquid, water can be used, for example. When water exists in a portion where the separation is in process, separation strength can be decreased. Moreover, electrostatic discharge damage to an electronic device or the like can be prevented. As the liquid, an organic solvent or the like can be used instead of water: for example, a neutral, alkaline, or acid aqueous solution may be used.

Figure 27:
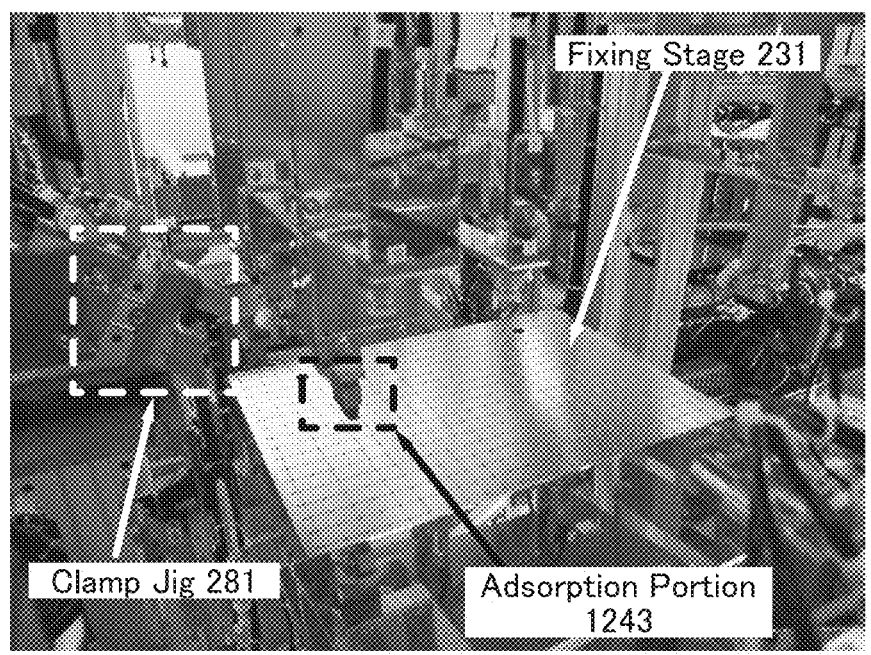
FIG. 27 is a photograph of a stack processing apparatus.

The clamp jigs 281 clamp part of the flexible substrate 215 to fix it and allow the part to be moved in the vertical direction and the horizontal direction. The separation step can be performed with only the adsorption jigs 1241 included in the adsorption mechanisms 1240; however, with only the adsorption jigs 1241 that fix only part of the flexible substrate 215, the flexible substrate 215 is deformed, which makes it is difficult to carry on the separation uniformly. When the flexible substrate 215 is deformed, the adsorption jigs might come off or the component might be cut, for example. For this reason, it is preferable that the separation is performed stably in the following manner: the flexible substrate 215 is fixed with the clamp jigs 281 in addition to the adsorption jigs 1241, and then the clamp jigs are pulled in the vertical direction and the horizontal direction to make the flexible substrate 215 under tension. FIG. 27 is a photograph of the stack processing apparatus of one embodiment of the present invention that includes the fixing stage 231, the adsorption portions 1243, and the clamp jigs 281.

Next, description is given of an example of a separation step using the stack processing apparatus that is one embodiment of the present invention. Note that in the processed member 201 used in the separation step, a thin component is provided between the flexible substrate 215 and the substrate 212, and a separation layer is provided between the substrate 212 and the component. In addition, a slit that reaches the separation layer (i.e., separation starting point) is made in the flexible substrate 215 and the component. An arrow illustrated with each adsorption jig schematically illustrates the move distance in the upward direction of the adsorption portion 1243 which is included in each adsorption jig, or strength required of lifting the adsorption portion 1243 upward.

Figure 8A:
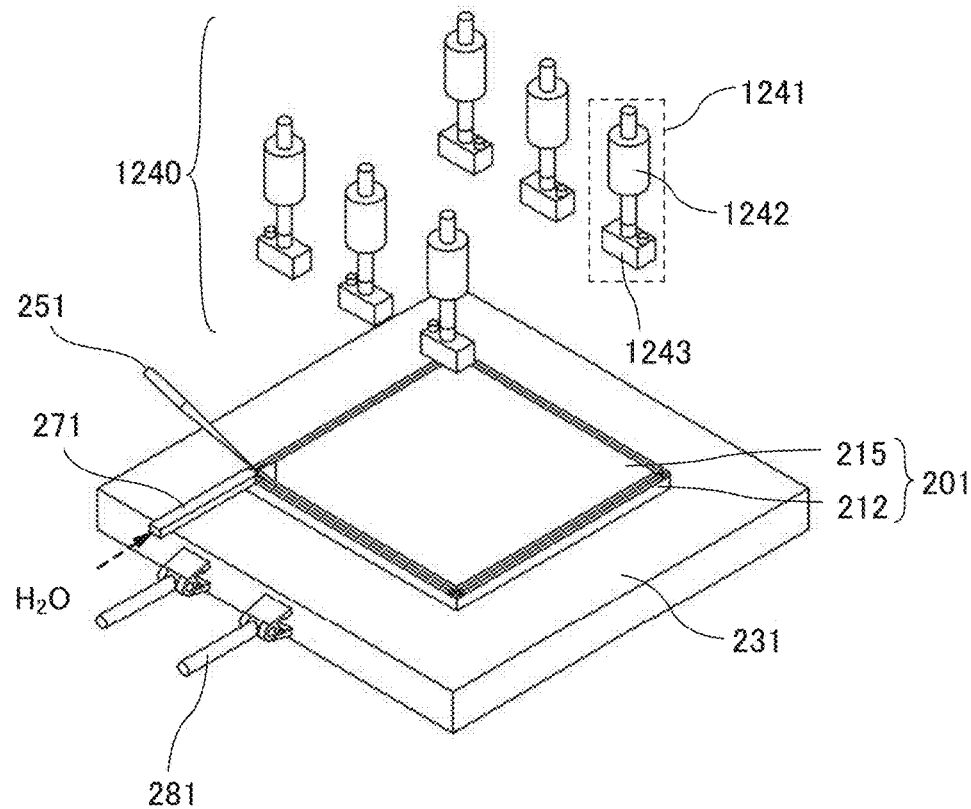
FIGS. 8A and 8B illustrate a separation step performed with a stack processing apparatus.

First, as illustrated in FIG. 8A, the needle 251 is inserted into a corner of the slit 211, and is pressed onto the flexible substrate 215 or is operated so as to turn over the flexible substrate 215; thus, the separation is partly carried on. Here, when the separation is not carried on adequately, the separation step cannot be performed with the adsorption jigs in a later step. Note that as described above, in the case where a needed amount of separated area has been obtained, the step of using the needle does not need to be performed. Then, through the nozzle 271, water is injected into the region where the separation is carried on.

Figure 8B:
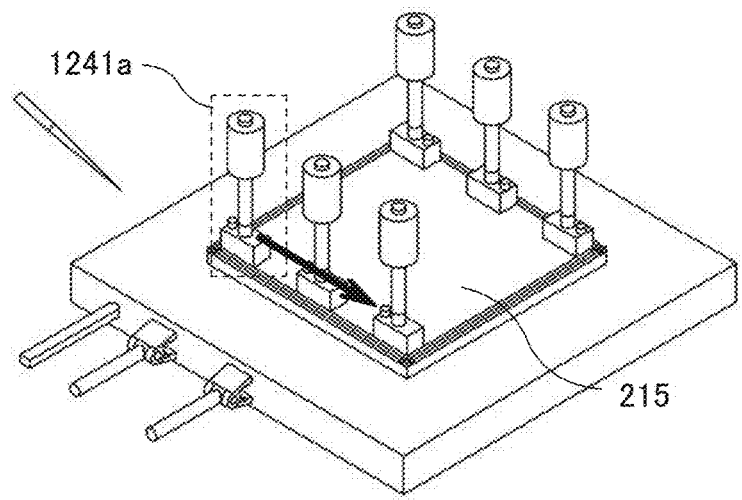

Next, as illustrated in FIG. 8B, the adsorption portions 1243 included in the plurality of adsorption jigs 1241 are adsorbed onto the flexible substrate 215 on the first plane of the processed member 201. The adsorption portion 1243 included in the adsorption jig 1241*a* which is closest to the corner where the separation is carried on is moved upward, and then the adsorption portions 1243 included in the adsorption jig 1241 along an arrow are sequentially moved upward.

Figure 9A:
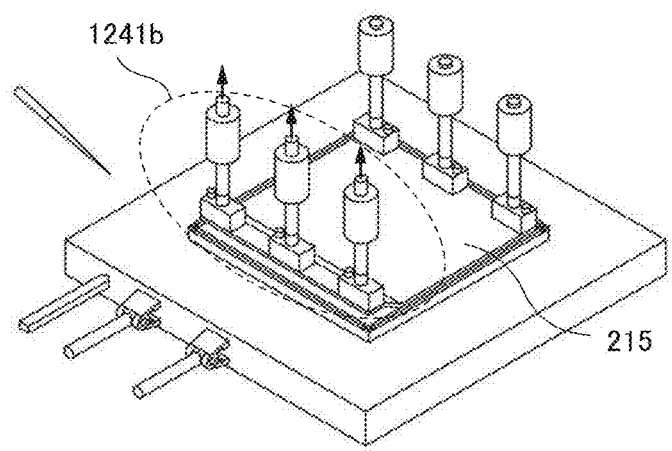
FIGS. 9A to 9C illustrate a separation step performed with a stack processing apparatus.

Through the above operation, the adsorption portions 1243 included in the adsorption jigs 1241*b* and surrounded by a dotted frame in FIG. 9A are moved upward, whereby the first side of the flexible substrate 215 that is the first plane of the processed member 201 is separated.

Figure 9B:
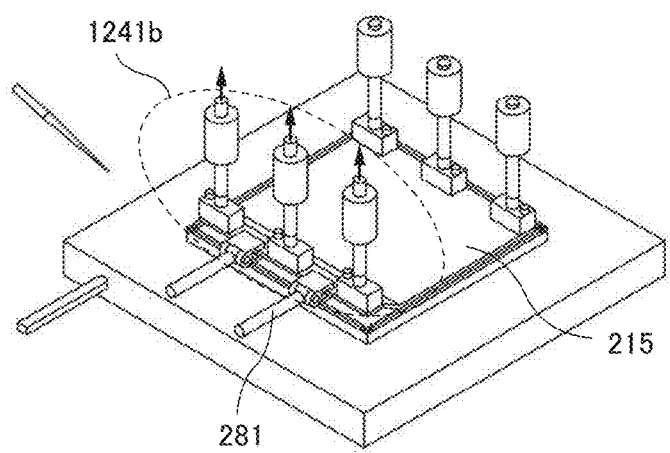

Next, as illustrated in FIG. 9B, the clamp jigs 281 are inserted into regions between the adsorption jigs 1241*b*, and clamp part of the separated flexible substrate 215. There is no limitation on the structure of the clamp jigs 281. For example, a mechanism can be used in which two parts including holding portions are in contact with a spindle and one or both of the two parts move to allow sandwiching. Alternatively, a mechanism can be used in which one or both of two parts including holding portions move while being parallel to each other, and thus performing sandwiching.

Figure 9C:
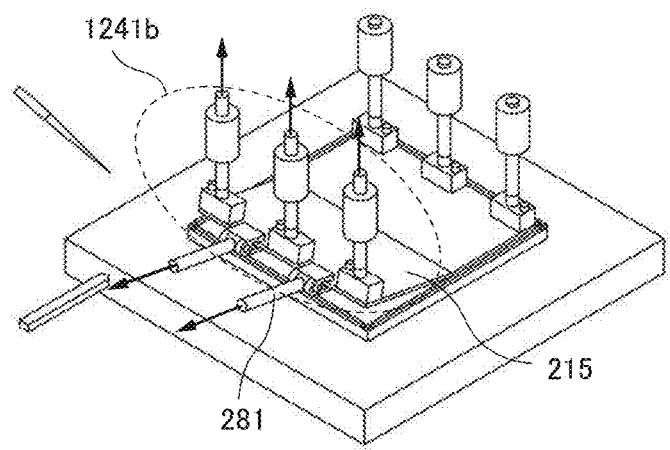

Then, as illustrated in FIG. 9C, the adsorption portions 1243 included in the adsorption jigs 1241*b* are moved upward, and the clamp jigs 281 are moved in the vertical direction and the horizontal direction; thus, the separation is carried on from the first side to the second side while the flexible substrate 215 is made under tension. Finally, the adsorption portions 1243 included in all the adsorption jigs 1241 are moved upward to complete the separation step. Note that to perform the separation stably, it is preferable to control the operation of the adsorption portions 1243 so that the separation end point is at a corner on the second side.

Figure 10:
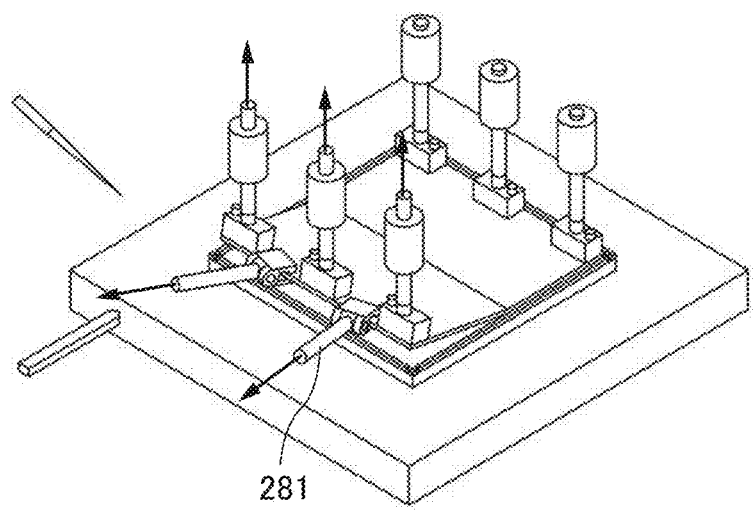
FIG. 10 illustrates a separation step performed with the stack processing apparatus.

In FIG. 9C, the clamp jigs 281 are moved in vertical to an end surface of the first side of the flexible substrate 215. However, as illustrated in FIG. 10, the clamp jigs 281 may be moved in the following manner: the clamp jigs 281 are fixed to be inclined to the end surface of the first side of the flexible substrate 215 and moved in the inclined direction. It becomes easy to apply tension uniformly to the whole region where the flexible substrate 215 is separated, which makes it possible to perform the separation step more stably without the component being cut in the portion where the separation is carried on. Furthermore, in the mode illustrated in FIG. 9C, the clamp jigs 281 may be fixed to the flexible substrate 215 and moved in directions as illustrated in FIG. 10.

In this embodiment, the six adsorption jigs 1241 are included in the adsorption mechanism 1240, the first side of the first plane of the processed member 201 that is on a side where the separation starts is fixed by the three adsorption jigs 1241, and the second side on a side where the separation ends is fixed by the three adsorption jigs 1241. The number of adsorption jigs in one embodiment of the present invention is not limited thereto. For example, the number of the adsorption jigs 1241 may be increased to fix the third and fourth sides of the first plane of the processed member 201. When the n adsorption jigs 1241 fix the first side of the first plane of the processed member 201 (n is an integer of two or more), the n−1 clamp jigs 281 are used to fix and clamp the flexible substrate 215 at spaces between the adsorption jigs 1241, for example. In the case where the clamp jigs 281 are fixed to be inclined as illustrated in FIG. 10 at this time, the closer the clamp jig 281 is placed to the center of the flexible substrate 215, the smaller the inclination of the clamp jig 281 is. This facilitates uniform application of tension to the whole region where the separation is performed even when the flexible substrate 215 has a large area.

Note that in the separation step, the separation rate is preferably managed. When the movement of the adsorption jigs and the clamp jigs 281 is fast and the separation cannot follow the movement, the separated portion is cut. For this reason, it is preferable that the angle between the flexible substrate 215 and the substrate 212 in the separation, tractive force in the movement of the adsorption jigs and the clamp jigs, and the like be managed with the use of image processing, a displacement sensor, a pull gauge, or the like to prevent the separation rate from being excessively high.

Figure 28:
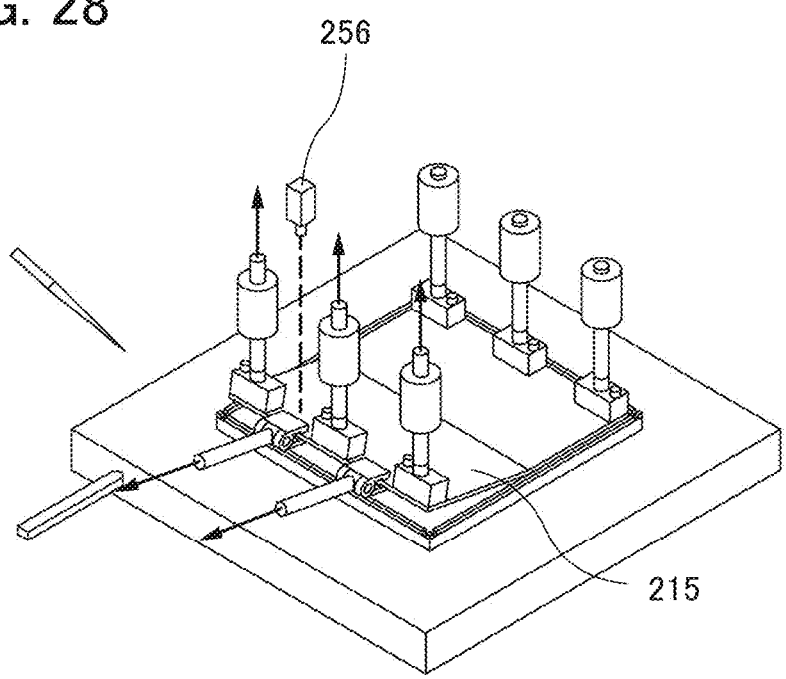
FIG. 28 illustrates a sensor that senses the position (height) of a flexible substrate.
Figure 29:
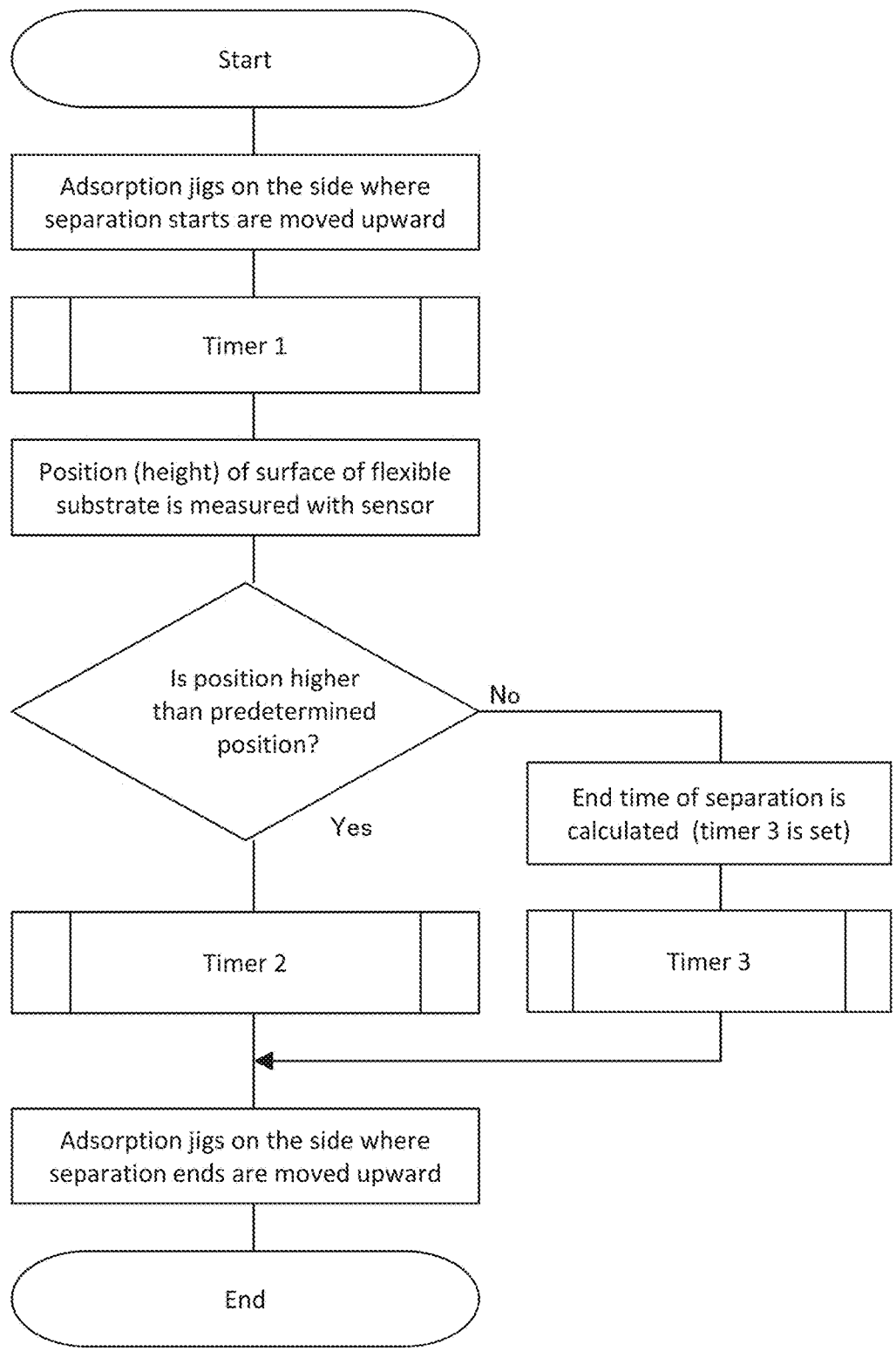
FIG. 29 is a flow chart for controlling a separation step.

As another example, a sensor 256 which detects the height of the flexible substrate 215 can be used as illustrated in FIG. 28. The position of the sensor 256 may be fixed; alternatively, a mechanism that allows movement in a direction in which the separation is carried on may be included. When the sensor 256 is fixed in the position illustrated in FIG. 28, the sensor 256 can be operated according to the flow chart of FIG. 29, for example.

First, the adsorption jigs 1241 on the side where the separation starts are moved upward, and the separation starts. After a predetermined period which is set in advance with a timer 1, the position (height) of a surface of the flexible substrate 215 is measured with the sensor 256. Here, when the position is higher than a predetermined position, the adsorption jigs 1241 on the side where the separation ends are moved upward after a predetermined period which is set in advance with a timer 2, whereby the separation step is completed. When the position (height) of the surface of the flexible substrate 215 is lower than the predetermined position, end time of the separation is calculated. The end time can be estimated by the time of the timer 1 and the measured position (height) of the surface of the flexible substrate 215. Then, a timer 3 is set for a period longer than the end time, and the adsorption jigs 1241 on the side where the separation ends after the predetermined period are moved upward; thus, the separation step is completed. In the above manner, the separation step can be performed appropriately even when the processed members 201 with different separation rates are processed.

Figure 30:
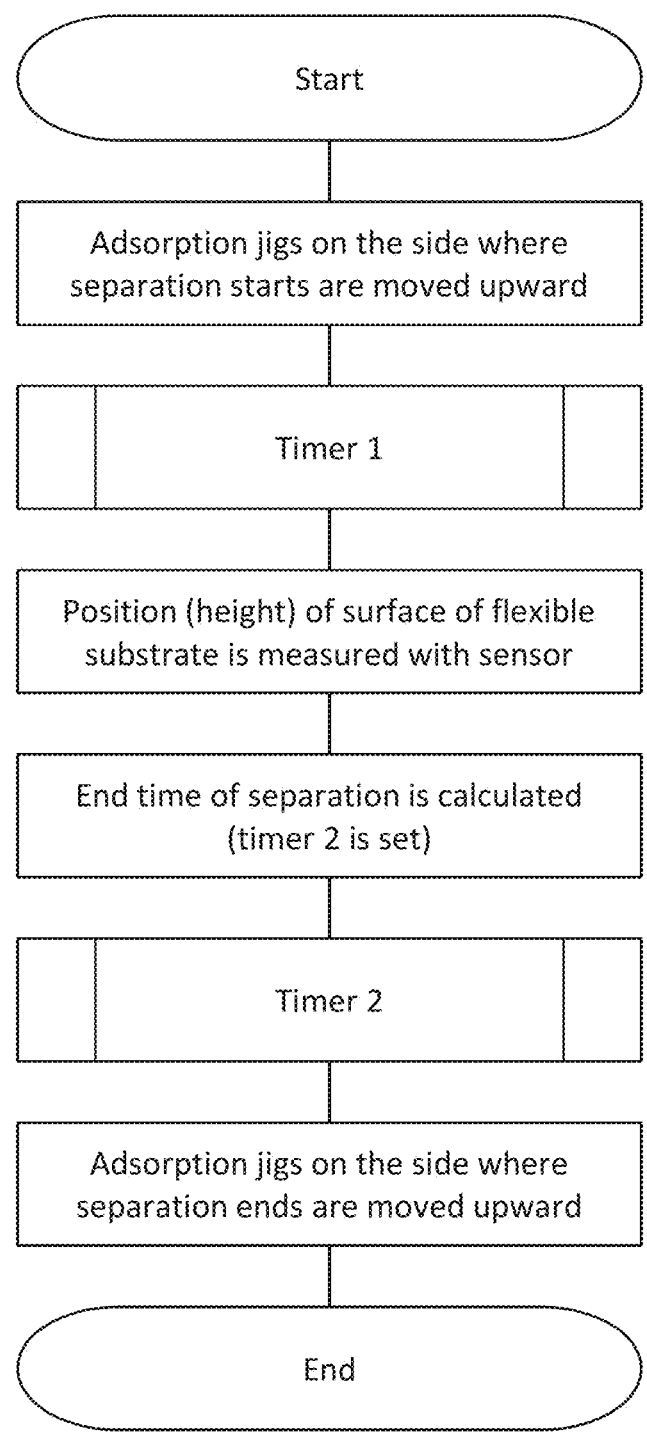
FIG. 30 is a flow chart for controlling a separation step.

In addition, as illustrated in the flow chart of FIG. 30, the end time of the separation may be calculated in the processing of each of the processed members 201.

The sensor 256 may be set in a position where the position (height) of the flexible substrate 215 in the vicinity of the adsorption jigs 1241 on the separation end side can be measured. In this case, the adsorption jigs 1241 on the separation end side may be moved upward after a change in the position (height) of the flexible substrate 215 in the position is measured to sense that the separation is close to the end.

Note that the sensor 256 can be provided in the stack processing apparatus that is described in Embodiment 1.

Note that a dryer for removing water or the like remaining after the separation step, an ultrasonic dry cleaner for removing a foreign substance, or the like may be provided.

With the use of the stack processing apparatus that is one embodiment of the present invention in the above manner, cutting of the component in the separated portion and the like are less likely to occur and the separation step of the processed member 201 can be performed with a high yield.

This embodiment can be combined with any of the other embodiments in this specification as appropriate.

(Embodiment 3)

In this embodiment, description is given of a stack processing apparatus including the stack processing apparatus in Embodiment 1 that is one embodiment of the present invention.

Figure 11:
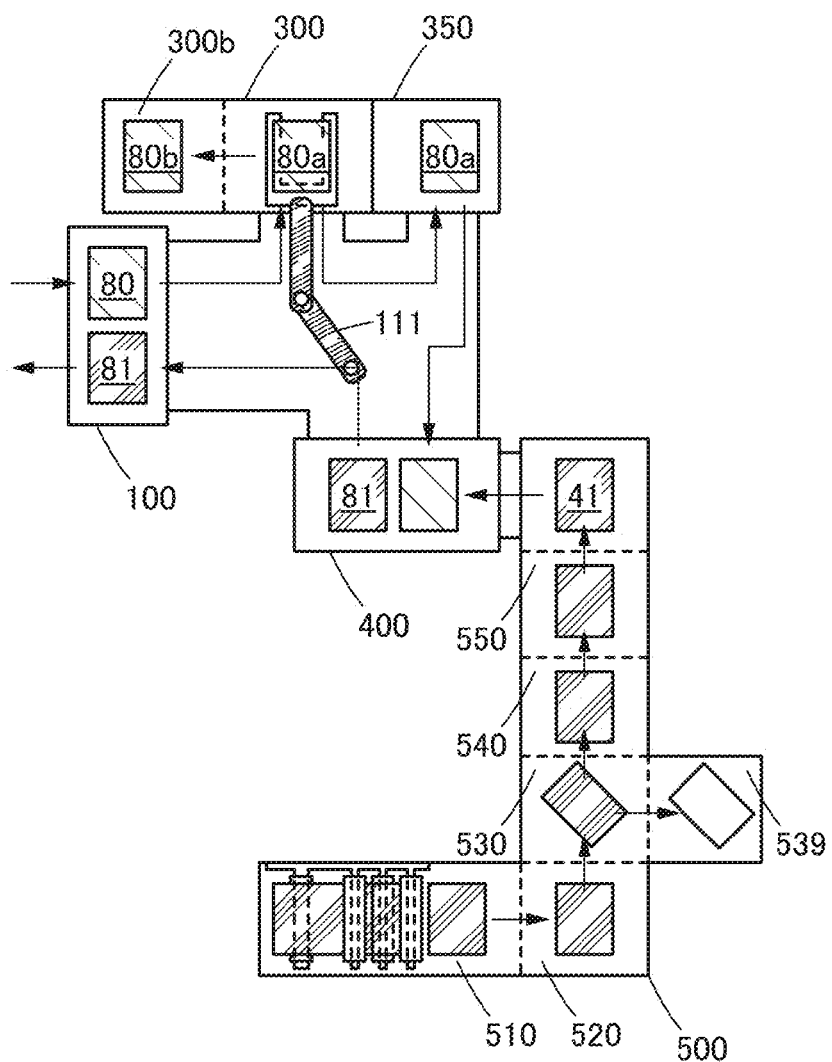
FIG. 11 illustrates a structure of a stack processing apparatus.

FIG. 11 is a schematic diagram illustrating a structure of a stack processing apparatus 1000 that is one embodiment of the present invention, and the conveyance path of a processed member and a stack in a process.

FIGS. 12A-1, 12A-2, 12B-1, 12B-2, 12C, 12D-1, 12D-2, 12E-1, and 12E-2 are schematic views illustrating a process for manufacturing a stack with the use of the stack processing apparatus 1000 that is one embodiment of the present invention. FIGS. 12A-1, 12B-1, 12D-1, and 12E-1 are cross-sectional views illustrating structures of a processed member and a stack. FIGS. 12A-2, 12B-2, 12D-2, and 12E-2 are top views corresponding to the cross-sectional views.

The processing apparatus 1000 includes a first loader unit 100, a first separating unit 300, a first attaching unit 400, and a support feeding unit 500 (see FIG. 11). Note that each unit can be named freely, and the name does not limit the function of each unit.

Note that the stack processing apparatus described in Embodiment 1 corresponds to the first separating unit 300.

The first loader unit 100 can feed a processed member 80. Note that the first loader unit 100 can also serve as a first unloader unit.

The first separating unit 300 separates one surface 80b of the processed member 80 to form a first remaining portion 80a (see FIG. 11 and FIGS. 12A-1, 12A-2, 12B-1, 12B-2, and 12C).

Note that the one surface 80b of the processed member 80 corresponds to the substrate 210 in Embodiment 1, and the first remaining portion 80a corresponds to the remaining portion (the substrate 220 and the component 260) obtained by separating the substrate 210 from the processed member 200 in Embodiment 1.

The first attaching unit 400 is fed with a first support 41, and attaches the first support 41 to the first remaining portion 80a with the use of a first adhesive layer 31 (see FIG. 11 and FIGS. 12D-1, 12D-2, 12E-1, and 12E-2).

The support feeding unit 500 feeds the first support 41 (see FIG. 11).

The first loader unit 100 also serving as the first unloader unit transports a stack 81 including the first remaining portion 80a and the first support 41 that are attached to each other with the first adhesive layer 31 (see FIG. 11 and FIGS. 12E-1 and 12E-2).

The stack processing apparatus of one embodiment of the present invention includes the first loader unit 100 also serving as the first unloader unit that feeds the processed member 80 and transports the stack 81 including the first remaining portion 80a and the first support 41 attached to each other with the first adhesive layer 31; the first separating unit 300 that separates the first remaining portion 80a; the first attaching unit 400 that attaches the first support 41 to the first remaining portion 80a; and the support feeding unit 500 that feeds the first support 41. This structure makes it possible to separate the one surface of the processed member 80 to form the first remaining portion 80a, and attach the first support 41 to the first remaining portion 80a. Consequently, a novel stack processing apparatus including the first remaining portion of the processed member and the first support can be provided.

Furthermore, the stack processing apparatus 1000 in this embodiment includes a first storage portion 300b, a first cleaning device 350, a conveying means 111, and the like.

The first storage portion 300b stores the one surface 80b separated from the processed member 80.

The first cleaning device 350 cleans the first remaining portion 80a obtained from the processed member 80.

The conveying means 111 conveys the processed member 80, the first remaining portion 80a, and the stack 81.

The following describes individual components included in the stack processing apparatus that is one embodiment of the present invention.

<<First Loader Unit>>

The first loader unit 100 can feed the processed member 80. For example, to allow the conveying means 111 to convey a plurality of processed members 80 successively, a multistage storage capable of storing the plurality of processed members 80 can be included.

Furthermore, the first loader unit 100 in this embodiment also serves as the first unloader unit. The first loader unit 100 transports the stack 81 including the first remaining portion 80a, the first adhesive layer 31, and the first support 41 attached to the first remaining portion 80a with the first adhesive layer 31. For example, to allow the conveying means 111 to convey a plurality of processed members 81 successively, a multistage storage capable of storing the plurality of processed members 81 can be included.

<<First Separating Unit>>

The first separating unit 300 includes a means for holding one surface of the processed member 80 and a means for holding the other surface facing the one surface. Both means are pulled away from each other, whereby the one surface of the processed member 80 is separated to form the first remaining portion 80a. Note that the detailed description of the first separating unit 300 can be referred to for the description in Embodiment 1.

<<First Attaching Unit>>

The first attaching unit 400 includes a means for forming the first adhesive layer 31 and a bonding means for attaching the first remaining portion 80a and the first support 41 to each other with the use of the first adhesive layer 31.

Examples of the means for forming the first adhesive layer 31 include a dispenser for applying a liquid adhesive and a device feeding an adhesive sheet shaped as a sheet in advance.

Note that the first adhesive layer 31 may be formed on the first remaining portion 80a and/or the first support 41.

Specifically, the first support 41 on which the first adhesive layer 31 is formed in advance may be used.

Examples of the bonding means for attaching the first remaining portion 80a and the first support include means for applying pressure that are controlled to apply a constant pressure or provide a uniform gap, such as a pair of rollers, a flat plate and a roller, and a pair of flat plates facing each other.

<<Support Feeding Unit>>

The support feeding unit 500 feeds the first support 41. For example, the support feeding unit 500 unrolls a film which is fed in a rolled shape, cuts the film to a predetermined length, activates a surface of the film, and feeds the film as the first support 41.

A method for manufacturing the stack 81 from the processed member 80 with the use of the stack processing apparatus 1000 is described below with reference to FIG. 11 and FIGS. 12A-1, 12A-2, 12B-1, 12B-2, 12C, 12D-1, 12D-2, 12E-1, and 12E-2.

The processed member 80 includes a first substrate 11, a first separation layer 12 on the first substrate 11, a first layer 13 to be separated (hereinafter simply referred to as the first layer 13) whose one surface is in contact with the first separation layer 12, a bonding layer 30 whose one surface is in contact with the other surface of the first layer 13, a base 25 in contact with the other surface of the bonding layer 30 (see FIGS. 12A-1 and 12A-2). Note that a method for manufacturing the processed member 80 is described in Embodiment 5.

<<First Step>>

The processed member 80 is conveyed to the first loader unit 100. The processed member 80 is fed from the first loader unit 100 to the first separating unit 300 by being conveyed with the conveying means 111. Note that in this embodiment, description is given of a case of using the processed member 80 in which separation starting points 13s are formed in advance in the vicinity of end portions of the bonding layer 30 (see FIGS. 12B-1 and 12B-2).

<<Second Step>>

The first separating unit 300 separates the one surface 80b of the processed member 80. Specifically, from the separation starting point 13s formed in the vicinity of the end portion of the bonding layer 30, the first substrate 11 is separated from the first layer 13 together with the first separation layer 12 (see FIG. 12C).

Through this step, the first remaining portion 80a can be obtained from the processed member 80. Specifically, the first remaining portion 80a includes the first layer 13, the bonding layer 30 whose one surface is in contact with the first layer 13, and the base 25 in contact with the other surface of the bonding layer 30.

<<Third Step>>

The conveying means 111 conveys the first remaining portion 80a, and the support feeding unit 500 feeds the first support 41.

The first attaching unit 400 forms the first adhesive layer 31 on the fed first remaining portion 80a (see FIGS. 12D-1 and 12D-2), and attaches the first remaining portion 80a and the first support 41 to each other with the use of the first adhesive layer 31.

Through this step, the stack 81 is obtained from the first remaining portion 80a. Specifically, the stack 81 includes the first support 41, the first adhesive layer 31, the first layer 13, the bonding layer 30 whose one surface is in contact with the first layer 13, and the base 25 in contact with the other surface of the bonding layer 30 (see FIGS. 12E-1 and 12E-2).

<<Fourth Step>>

The conveying means 111 conveys the stack 81, and the stack 81 is fed into the first loader unit 100 also serving as the first unloader unit.

Through this step, the stack 81 is ready to be transported.

<<Other Step>>

Note that when it takes time to cure the first adhesive layer 31, the stack 81 in which the first adhesive layer 31 is not cured yet is preferably transported to cure the first adhesive layer 31 outside the stack processing apparatus 1000, in which case occupancy time of the apparatus can be reduced.

This embodiment can be combined with any of the other embodiments in this specification as appropriate.

(Embodiment 4)

In this embodiment, description is given of a stack processing apparatus including the stack processing apparatuses in Embodiments 1 to 3 that are embodiments of the present invention.

Figure 13:
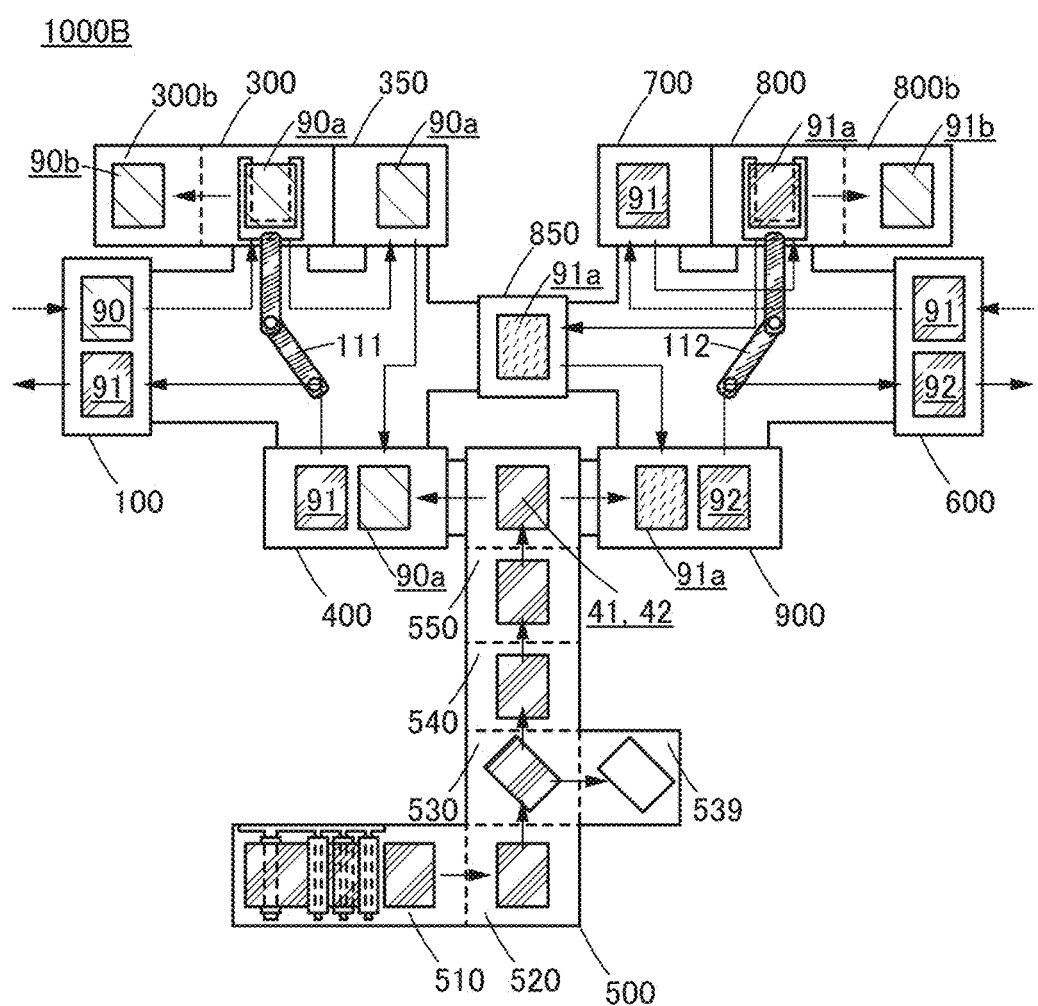
FIG. 13 illustrates a structure of a stack processing apparatus.

FIG. 13 is a schematic diagram illustrating a structure of a stack processing apparatus 1000B that is one embodiment of the present invention, and the conveyance path of a processed member and a stack in a process.

FIGS. 14A-1, 14A-2, 14B-1, 14B-2, 14C, 14D-1, 14D-2, 14E-1, and 14E-2 and FIGS. 15A-1, 15A-2, 15B, 15C, 15D-1, 15D-2, 15E-1, and 15E-2 are schematic views illustrating a process for manufacturing a stack with the use of the stack processing apparatus 1000B that is one embodiment of the present invention. FIGS. 14A-1, 14B-1, 14D-1, and 14E-1 and FIGS. 15A-1, 15D-1, and 15E-1 are cross-sectional views illustrating structures of a processed member and a stack. FIGS. 14A-2, 14B-2, 14D-2, and 14E-2 and FIGS. 15A-2, 15D-2, and 15E-2 are top views corresponding to the cross-sectional views.

The stack processing apparatus 1000B in this embodiment includes the first loader unit 100, the first separating unit 300, the first attaching unit 400, the support feeding unit 500, a second loader unit 600, a starting point forming unit 700, a second separating unit 800, and a second attaching unit 900. Note that each unit can be named freely, and the name does not limit the function of each unit.

Note that the stack processing apparatus described in Embodiment 1 corresponds to the first separating unit 300.

The first loader unit 100) can feed a processed member 90. Note that the first loader unit 100 can also serve as a first unloader unit.

The first separating unit 300 separates one surface 90b of the processed member 90 to form a first remaining portion 90a (see FIGS. 14A-1, 14A-2, 14B-1, 14B-2, and 14C).

Note that the one surface 90b of the processed member 90 corresponds to the substrate 210 in Embodiment 1, and the first remaining portion 90a corresponds to the remaining portion (the substrate 220 and the component 260) obtained by separating the substrate 210 from the processed member 200 in Embodiment 1.

The first attaching unit 400 is fed with the first support 41, and attaches the first support 41 to the first remaining portion 90a with the use of the first adhesive layer 31 (see FIGS. 14D-1, 14D-2, 14E-1, and 14E-2).

The support feeding unit 500 feeds the first support 41 and a second support 42.

The first loader unit 100 also serving as the first unloader unit transports a stack 91 including the first remaining portion 90a and the first support 41 that are attached to each other with the first adhesive layer 31 (see FIGS. 14E-1 and 14E-2).

The second loader unit 600 can feeds the stack 91. Note that the second loader unit 600 can also serve as a second unloader unit.

The starting point forming unit 700 forms separation starting points 91s in the vicinity of end portions of the first remaining portion 90a and a first support 41b in the stack 91 (see FIGS. 15A-1 and 15A-2).

The second separating unit 800 separates one surface 91b of the stack 91 to form a second remaining portion 91a (see FIG. 15B).

Note that the stack processing apparatus described in Embodiment 2 corresponds to the second separating unit 800.

The one surface 91b of the stack 91 corresponds to the substrate 212 described in Embodiment 2, and the second remaining portion 91a corresponds to the flexible substrate 215 and the component described in Embodiment 2.

The second attaching unit 900 is fed with the second support 42, and attaches the second support 42 to the second remaining portion 91a with the use of a second adhesive layer 32 (see FIGS. 15D-1, 15D-2, 15E-1, and 15E-2).

The second loader unit 600 also serving as the second unloader unit transports a stack 92 including the second remaining portion 91a and the second support 42 that are attached to each other with the second adhesive layer 32 (see FIG. 13 and FIGS. 15E-1 and 15E-2).

The stack processing apparatus in this embodiment includes the first loader unit 100 also serving as the first unloader unit that feeds the processed member 90 and transports the stack 91 including the first remaining portion 90a and the first support 41 attached to each other with the first adhesive layer 31; the first separating unit 300 that separates the first remaining portion 90a; the first attaching unit 400 that attaches the first support 41 to the first remaining portion 90a; and the support feeding unit 500 that feeds the first support 41 and the second support 42; the second loader unit 600 that feeds the stack 91 and transports the stack 92 including the second remaining portion 91a and the second support 42 attached to each other with the second adhesive layer 32: the starting point forming unit 700 that forms a separation starting point; the second separating unit 800 that separates the second remaining portion 91a; and the second attaching unit 900 that attaches the second support 42 to the second remaining portion 91a. This structure makes it possible to separate the both surface of the processed member 90 to form the second remaining portion 91a, and attach the first support 41 and the second support 42. Consequently, a novel processing apparatus of the stack including the second remaining portion of the processed member, the first support, and the second support can be provided.

Furthermore, the stack processing apparatus 1000B in this embodiment includes the first storage portion 300b, a second storage portion 800b, the first cleaning device 350, a second cleaning device 850, the conveying means 111, a conveying means 112, and the like.

The first storage portion 300b stores the one surface 90b separated from the processed member 90.

The second storage portion 800b stores the one surface 91b separated from the stack 91.

The first cleaning device 350 cleans the first remaining portion 90a obtained from the processed member 90.

The second cleaning device 850 cleans the second remaining portion 91a obtained from the stack 91.

The conveying means 111 conveys the processed member 90, the first remaining portion 90a obtained from the processed member 90, and the stack 91.

The conveying means 112 conveys the stack 91, the second remaining portion 91a obtained from the stack 91, and the stack 92.

The following describes individual components included in the stack processing apparatus that is one embodiment of the present invention.

Note that the stack processing apparatus 1000B is different from the stack processing apparatus 1000 described in Embodiment 3 in that the second loader unit 600, the starting point forming unit 700, the second separating unit 800, the second attaching unit 900, the second storage portion 800b, and the second cleaning device 850 are included. In this embodiment, a structure different from that of the stack processing apparatus 1000 is described, and the description in Embodiment 3 is referred to for a structure common to that of the stack processing apparatus 1000.

<<Second Loader Unit>>

The second loader unit 600 can have the same structure as the first loader unit described in Embodiment 3 except that the second loader unit 600 feeds the stack 91.

Furthermore, the second loader unit 600 in this embodiment also serves as the second unloader unit.

<<Starting Point Forming Unit>>

The starting point forming unit 700 includes a cutting means which cuts the first support 41 and the first adhesive layer 31 and separates part of a second layer 23 to be separated (hereinafter simply referred to as the second layer 23) from a second separation layer 22, for example.

Specifically, the cutting means includes one or a plurality of blades which have a sharp tip, and relatively moves the blade to the stack 91.

<<Second Separating Unit>>

The second separating unit 800 includes a means for holding one surface of the stack 91 and a means for holding the other surface facing the one surface. Both means are pulled away from each other, whereby the one surface of the stack 91 is separated to form the second remaining portion 91a.

<<Second Attaching Unit>>

The second attaching unit 900 includes a means for forming the second adhesive layer 32 and a bonding means for attaching the second remaining portion 91a and the second support 42 to each other with the use of the second adhesive layer 32.

The means for forming the second adhesive layer 32 can have a structure similar to that of the first attaching unit 400 described in Embodiment 3.

Note that the second adhesive layer 32 may be formed on the second remaining portion 91a and/or the second support 42. Specifically, the second support 42 on which the second adhesive layer 32 is formed in advance may be used.

The bonding means for attaching the second remaining portion 91a and the second support 42 to each other can have a structure similar to that of the first attaching unit 400 described in Embodiment 3.

A method for manufacturing the stack 91 from the processed member 90 with the use of the stack processing apparatus 1000B is described below with reference to FIG. 13, FIGS. 14A-1, 14A-2, 14B-1, 14B-2, 14C, 14D-1, 14D-2, 14E-1, and 14E-2, and FIGS. 15A-1, 15A-2, 15B, 15C, 15D-1, 15D-2, 15E-1, and 15E-2.

The processed member 90 has the same structure as the processed member 80 except that a first base includes a second substrate 21, the second separation layer 22 on the second substrate 21, and the second layer 23 whose one surface is in contact with the second separation layer 22.

Specifically, the processed member 90 includes the first substrate 11, the first separation layer 12 on the first substrate 11, the first layer 13 whose one surface is in contact with the first separation layer 12, the bonding layer 30 whose one surface is in contact with the other surface of the first layer 13, the second layer 23 whose one surface is in contact with the other surface of the bonding layer 30, the second separation layer 22 whose one surface is in contact with the other surface of the second layer 23, and the second substrate 21 in contact with the other surface of the second separation layer 22 (see FIGS. 14A-1 and 14A-2). Note that in this embodiment, description is given of a case of using the processed member 90 in which the separation starting points 13s are formed in advance in the vicinity of end portions of the bonding layer 30 (see FIGS. 14B-1 and 14B-2). Note that a method for manufacturing the processed member 90 is described in Embodiment 5.

<<First Step>>

The processed member 90 is conveyed to the first loader unit 100. The processed member 90 is fed from the first loader unit 100 to the first separating unit 300 by being conveyed with the conveying means 111.

<<Second Step>>

The first separating unit 300 separates the one surface 90b of the processed member 90. Specifically, from the separation starting point 13s formed in the vicinity of the end portion of the bonding layer 30, the first substrate 11 is separated from the first layer 13 together with the first separation layer 12 (see FIG. 14C).

Through this step, the first remaining portion 90a can be obtained from the processed member 90. Specifically, the first remaining portion 90a includes the first layer 13, the bonding layer 30 whose one surface is in contact with the first layer 13, the second layer 23 whose one surface is in contact with the other surface of the bonding layer 30, the second separation layer 22 whose one surface is in contact with the other surface of the second layer 23, and the second substrate 21 in contact with the other surface of the second separation layer 22.

<<Third Step>>

The conveying means 111 conveys the first remaining portion 90a, and the support feeding unit 500 feeds the first support 41.

The first attaching unit 400 forms the first adhesive layer 31 on the fed first remaining portion 90a (see FIGS. 14D-1 and 14D-2), and attaches the first remaining portion 90a and the first support 41 to each other with the use of the first adhesive layer 31.

Through this step, the stack 91 is obtained from the first remaining portion 90a. Specifically, the stack 91 includes the first support 41, the first adhesive layer 31, the first layer 13, the bonding layer 30 whose one surface is in contact with the first layer 13, the second layer 23 whose one surface is in contact with the other surface of the bonding layer 30, the second separation layer 22 whose one surface is in contact with the other surface of the second layer 23, and the second substrate 21 in contact with the other surface of the second separation layer 22 (see FIGS. 14E-1 and 14E-2).

<<Fourth Step>>

The conveying means 111 conveys the stack 91, and the stack 91 is fed into the first loader unit 100 also serving as the first unloader unit.

Through this step, the stack 91 is ready to be transported. For example, when it takes time to cure the first adhesive layer 31, the stack 91 in which the first adhesive layer 31 is not cured yet can be transported to cure the first adhesive layer 31 outside the stack processing apparatus 1000B. Thus, occupancy time of the apparatus can be reduced.

<<Fifth Step>>

The stack 91 is conveyed to the second loader unit 600. The stack 91 is fed from the second loader unit 600 to the starting point forming unit 700 by being conveyed with the conveying means 112.

<<Sixth Step>>

The starting point forming unit 700 peels part of the second layer 23 in the vicinity of the end portion of the first adhesive layer 31 of the stack 91 from the second separation layer 22 to form the separation starting points 91s.

For example, the first support 41 and the first adhesive layer 31 are cut from a side where the first support 41 is provided, and part of the second layer 23 is separated from the second separation layer 22.

Specifically, the first adhesive layer 31 and the first support 41 in a region which is over the second separation layer 22 and in which the second layer 23 is provided are cut to draw a closed curve with a blade or the like including a sharp tip, and along the closed curve, the second layer 23 is partly separated from the second separation layer 22 (see FIGS. 15A-1 and 15A-2).

Through this step, the separation starting points 91s are formed in the cut portion in the vicinity of the end portions of the first support 41b and the first adhesive layer 31.

<<Seventh Step>>

The second separating unit 800 separates the second remaining portion 91a from the stack 91. Specifically, from the separation starting point formed in the vicinity of the end portion of the first adhesive layer 31, the second substrate 21 is separated from the second layer 23 together with the second separation layer 22 (see FIG. 15C).

Through this step, the second remaining portion 91a is obtained from the stack 91. Specifically, the second remaining portion 91a includes the first support 41b, the first adhesive layer 31, the first layer 13, the bonding layer 30 whose one surface is in contact with the first layer 13, and the second layer 23 whose one surface is in contact with the other surface of the bonding layer 30.

<<Eighth Step>>

The conveying means 112 conveys the second remaining portion 91a, and turns the second remaining portion 91a so that the second layer 23 faces upward. In the second cleaning device 850, the fed second remaining portion 91a is cleaned.

The conveying means 112 conveys the second remaining portion 91a, and the support feeding unit 500 feeds the second support 42.

Note that the second remaining portion 91a may be directly fed into the second attaching unit 900 without being fed into the second cleaning device 850.

The second attaching unit 900 forms the second adhesive layer 32 on the fed second remaining portion 91a (see FIGS. 15D-1 and 15D-2), and attaches the second remaining portion 91a to the second support 42 with the use of the second adhesive layer 32 (see FIGS. 15E-1 and 15E-2).

Through this step, the stack 92 is obtained from the second remaining portion 91a. Specifically, the stack 92 includes the first layer 13, the first support 41b attached to one surface of the first layer 13 with the use of the first adhesive layer 31, the bonding layer 30 whose one surface is in contact with the other surface of the first layer 13, the second layer 23 whose one surface is in contact with the other surface of the bonding layer 30, and the second support 42 attached to the other surface of the second layer 23 with the use of the second adhesive layer 32.

<<Ninth Step>>

The conveying means 112 conveys the stack 92, and the stack 92 is fed into the second loader unit 600 also serving as the second unloader unit.

Through this step, the stack 92 is ready to be transported.

<Modification Example>

A modification example of this embodiment is described with reference to FIG. 16.

Figure 16:
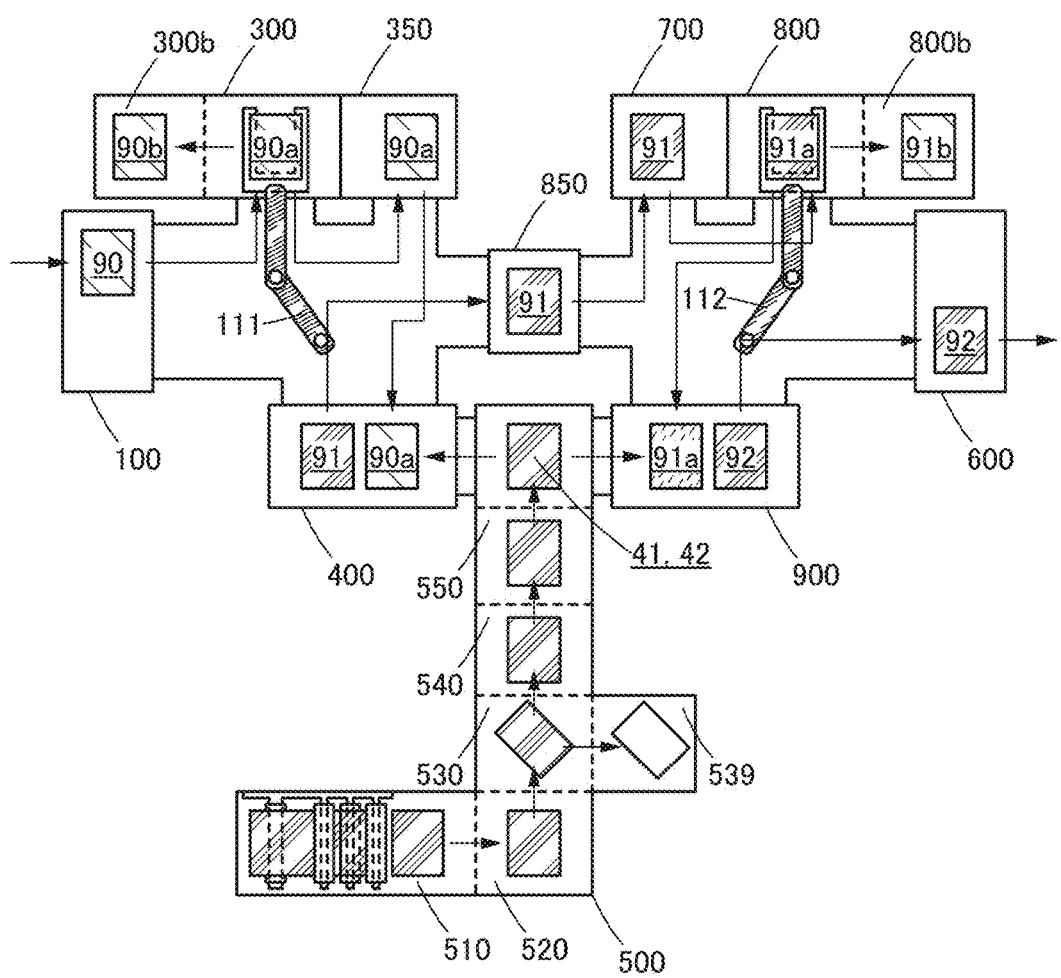
FIG. 16 illustrates a structure of a stack processing apparatus.

FIG. 16 is a schematic diagram illustrating a structure of the stack processing apparatus 1000B that is one embodiment of the present invention, and the conveyance path of a processed member and a stack in a process.

In the modification example of this embodiment, a method for manufacturing the stack 92 from the processed member 90 with the use of the stack processing apparatus 1000B, which is different from the above-described method, is described with reference to FIGS. 14A-1, 14A-2, 14B-1, 14B-2, 14C, 14D-1, 14D-2, 14E-1, and 14E-2; FIGS. 15A-1, 15A-2, 15B. 15C, 15D-1, 15D-2, 15E-1, and 15E-2; and FIG. 16.

Specifically, the differences between the method in this modification example and the above-described method are as follows: in the fourth step, the conveying means 111 conveys the stack 91 and the stack 91 is fed not into the first loader unit 100 also serving as the first unloader unit but into the second cleaning device 850; in the fifth step, the conveying means 112 conveys the stack 91 and the stack 91 is fed into the starting point forming unit 700; and in the eighth step, the second remaining portion 91a is directly fed into the second attaching unit 900 without being fed into the second cleaning device 850. Thus, different portions will be described in detail below. Refer to the above description for portions where the same methods can be employed.

<Modification Example of Fourth Step>

The conveying means 111 conveys the stack 91 and the stack 91 is fed into the second cleaning device 850.

In the modification example of this embodiment, the second cleaning device 850 is used as a delivery chamber in which the conveying means 111 delivers the stack 91 to the conveying means 112 (see FIG. 16).

Through this step, the stack 91 can be continuously processed without being transported from the stack processing apparatus 1000B.

<Modification Example of Fifth Step>

The conveying means 112 conveys the stack 91, and the stack 91 is fed into the starting point forming unit 700.

<<Modification Example of Eighth Step>>

The conveying means 112 conveys the second remaining portion 91a, and turns the second remaining portion 91a so that the second layer 23 faces upward. The second remaining portion 91a is fed into the second attaching unit 900.

The second attaching unit 900 forms the second adhesive layer 32 on the fed second remaining portion 91a (see FIGS. 15D-1 and 15D-2), and attaches the second remaining portion 91a to the second support 42 with the use of the second adhesive layer 32 (see FIGS. 15E-1 and 15E-2).

Through this step, the stack 92 is obtained from the second remaining portion 91a. Specifically, the stack 92 includes the first layer 13, the first support 41b attached to one surface of the first layer 13 with the use of the first adhesive layer 31, the bonding layer 30 whose one surface is in contact with the other surface of the first layer 13, the second layer 23 whose one surface is in contact with the other surface of the bonding layer 30, and the second support 42 attached to the other surface of the second layer 23 with the use of the second adhesive layer 32.

This embodiment can be combined with any of the other embodiments in this specification as appropriate.

(Embodiment 5)

In this embodiment, a structure of a processed member which is applicable to the stack processing apparatus that is one embodiment of the present invention is described with reference to FIGS. 17A-1 and 17A-2.

FIGS. 17A-1 and 17A-2 are schematic views illustrating a structure of a processed member that can be used to form a stack with the use of the stack processing apparatus that is one embodiment of the present invention.

FIG. 17A-1 is a cross-sectional view illustrating a structure of the processed member 90, and FIG. 17A-2 is a top view corresponding to the cross-sectional view.

<Processed Member>

The processed member 90 includes the first substrate 11, the first separation layer 12 on the first substrate 11, the first layer 13 whose one surface is in contact with the first separation layer 12, the bonding layer 30 whose one surface is in contact with the other surface of the first layer 13, the second layer 23 whose one surface is in contact with the other surface of the bonding layer 30, the second separation layer 22 whose one surface is in contact with the other surface of the second layer 23, and the second substrate 21 in contact with the other surface of the second separation layer 22 (see FIGS. 17A-1 and 17A-2).

Note that the separation starting points 13s may be provided in the vicinity of the end portions of the bonding layer 30.

<<First Substrate>>

There is no particular limitation on the first substrate 11 as long as the first substrate 11 has heat resistance high enough to withstand a manufacturing process and a thickness and a size which can be used in a manufacturing apparatus.

Examples of a material that can be used for the first substrate 11 include glass, a ceramic, a metal, an inorganic material, and a resin.

Specifically, as the glass, non-alkali glass, soda-lime glass, potash glass, crystal glass, or the like can be given. As the metal. SUS, aluminum, or the like can be given.

The first substrate 11 may have a single-layer structure, a stacked-layer structure, or the like. For example, a stacked-layer structure including a base and an insulating layer that prevents diffusion of impurities contained in the base may be employed. Specifically, a structure can be employed in which glass and various base layers that prevent diffusion of impurities contained in the glass, such as a silicon oxide layer, a silicon nitride layer, and a silicon oxynitride layer, are stacked.

<<First Separation Layer>>

There is no particular limitation on the first separation layer 12 as long as the first separation layer 12 can be used to separate the first layer 13 formed thereon and has heat resistance high enough to withstand the manufacturing process.

As a material that can be used for the first separation layer 12, an inorganic material, an organic material, or the like can be given.

Specific examples of the inorganic material include a metal, an alloy, a compound, and the like that contain any of the following elements: tungsten, molybdenum, titanium, tantalum, niobium, nickel, cobalt, zirconium, zinc, ruthenium, rhodium, palladium, osmium, iridium, and silicon.

Specific examples of the organic material include polyimide, polyester, polyolefin, polyamide, polycarbonate, an acrylic resin, and the like.

The first separation layer 12 may have a single-layer structure, a stacked-layer structure, or the like. For example, a stacked-layer structure including a layer containing tungsten and a layer containing an oxide of tungsten can be employed.

The layer containing an oxide of tungsten may be formed by stacking another layer with a layer containing tungsten; for example, the layer containing an oxide of tungsten may be formed by stacking a film containing oxygen, such as a silicon oxide film or a silicon oxynitride film, with a layer containing tungsten.

The layer containing an oxide of tungsten may be formed by performing thermal oxidation treatment, oxygen plasma treatment, nitrous oxide ($N_2O$) plasma treatment, treatment with a solution having strong oxidizing power (e.g., ozone water), or the like on a surface of a layer containing tungsten.

<<First Layer to be Separated>>

There is no particular limitation on the first layer 13 as long as the first layer 13 can be separated from the first separation layer 12 and has heat resistance high enough to withstand the manufacturing process.

As a material that can be used for the first layer 13, an inorganic material, an organic material, or the like can be given.

The first layer 13 may have a single-layer structure, a stacked-layer structure, or the like. For example, a structure may be employed in which a functional layer overlapping with the first separation layer 12 and an insulating layer that is provided between the first separation layer 12 and the functional layer to prevent diffusion of impurities which impair the characteristics of the functional layer are stacked. Specifically, a structure can be employed in which a silicon oxynitride layer, a silicon nitride layer, and the functional layer are stacked in this order over the first separation layer 12.

Examples of the functional layer that can be used for the first layer 13 include a functional circuit, a functional element, an optical element, and a functional film; and a layer including a plurality of elements selected from the above examples. Specific examples are a pixel circuit of a display device, a driver circuit of the display device, a display element, a color filter, and a moisture-proof film; and a layer including a plurality of elements selected from the above examples.

<<Bonding Layer>>

There is no particular limitation on the bonding layer 30 as long as the bonding layer 30 bonds the first layer 13 and the second layer 23 to each other.

As a material that can be used for the bonding layer 30, an inorganic material, an organic resin, or the like can be given.

Specifically, a glass layer with a melting point of 400° C. or lower, preferably 300° C. or lower, an adhesive, or the like can be used.

Examples of the adhesive that can be used for the bonding layer 30 include a light curable adhesive such as a UV curable adhesive, a reactive curable adhesive, a heat curable adhesive, and an anaerobic adhesive.

Examples of such adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin.

<<Separation Starting Point>>

In the processed member 90, the separation starting points 13s may be provided in the vicinity of the end portions of the bonding layer 30.

The separation starting points 13s are formed by peeling part of the first layer 13 from the first separation layer 12 side.

The separation starting points 13s can be formed by inserting a sharp tip into the first layer 13 from the first substrate 11 side; alternatively, the separation starting points 13s can be formed by peeling part of the first layer 13 from the first separation layer 12 by a noncontact method using a laser or the like (e.g., a laser ablation method).

<<Second Substrate>>

As the second substrate 21, the same substrate as the first substrate 11 can be used. Alternatively, the second substrate 21 and the first substrate 11 do not need to have the same structure.

<<Second Separation Layer>>

As the second separation layer 22, the same layer as the first separation layer 12 can be used. Alternatively, the second separation layer 22 and the first separation layer 12 do not need to have the same structure.

<<Second Layer to be Separated>>

The second layer 23 can have the same structure as the first layer 13. Alternatively, the second layer 23 can have a structure different from that of the first layer 13.

For example, a structure may be employed in which the first layer 13 includes a functional circuit and the second layer 23 includes a functional layer that prevents diffusion of impurities into the functional circuit.

Specifically, a structure may be employed in which the first layer 13 includes a pixel circuit of a display device, a driver circuit of the display device, and a light-emitting element that is connected to the pixel circuit and emits light to the second layer, and the second layer 23 includes a color filter and a moisture-proof film.

This embodiment can be combined with any of the other embodiments in this specification as appropriate.

(Embodiment 6)

In this embodiment, description is given of an example of a flexible light-emitting device (light-emitting panel) that can be manufactured with the use of any of the stack processing apparatuses described in Embodiments 1 to 4.

Specific Example 1

Figure 18A:
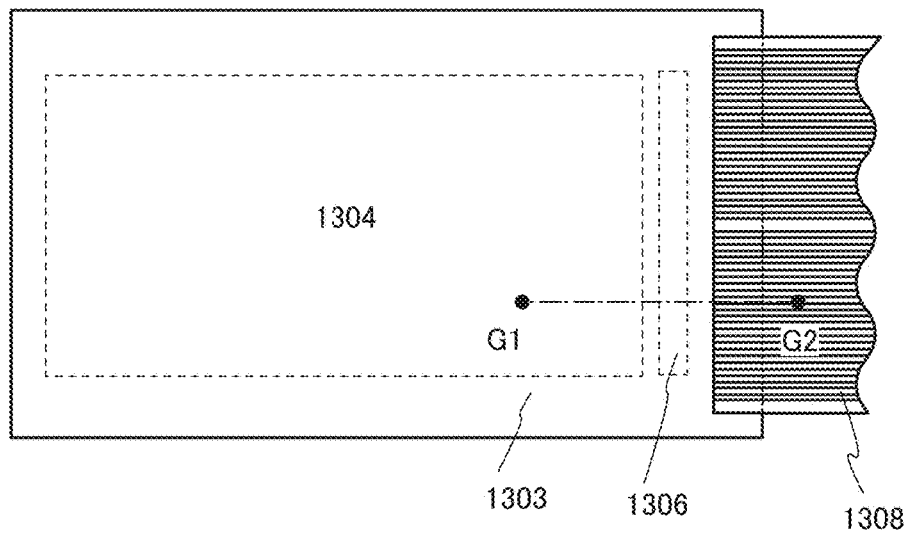
FIGS. 18A and 18B illustrate a light-emitting panel.
Figure 18B:
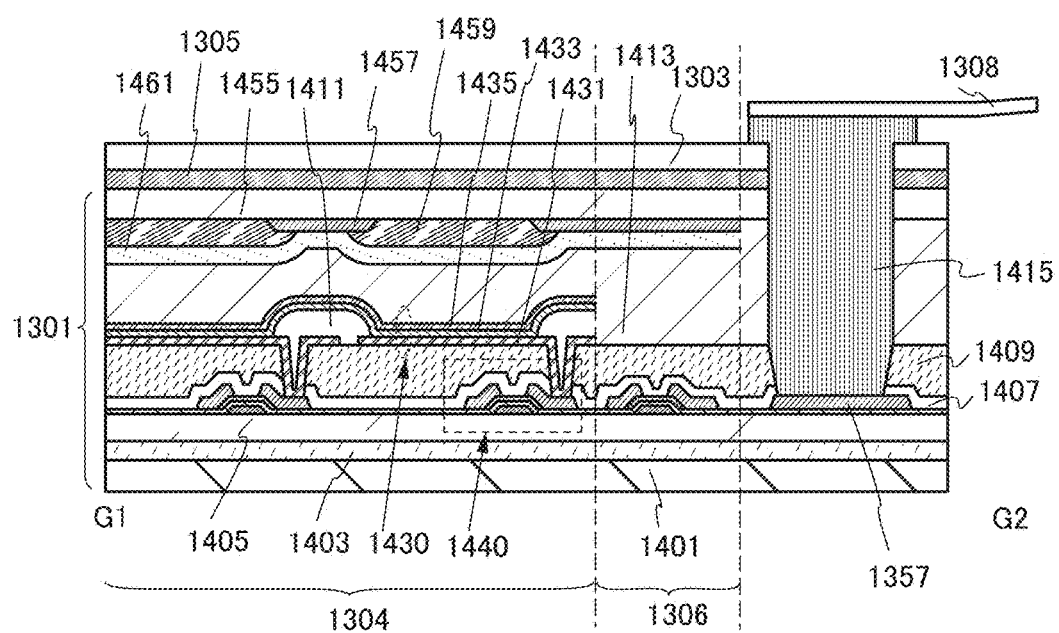
Figure 22A:
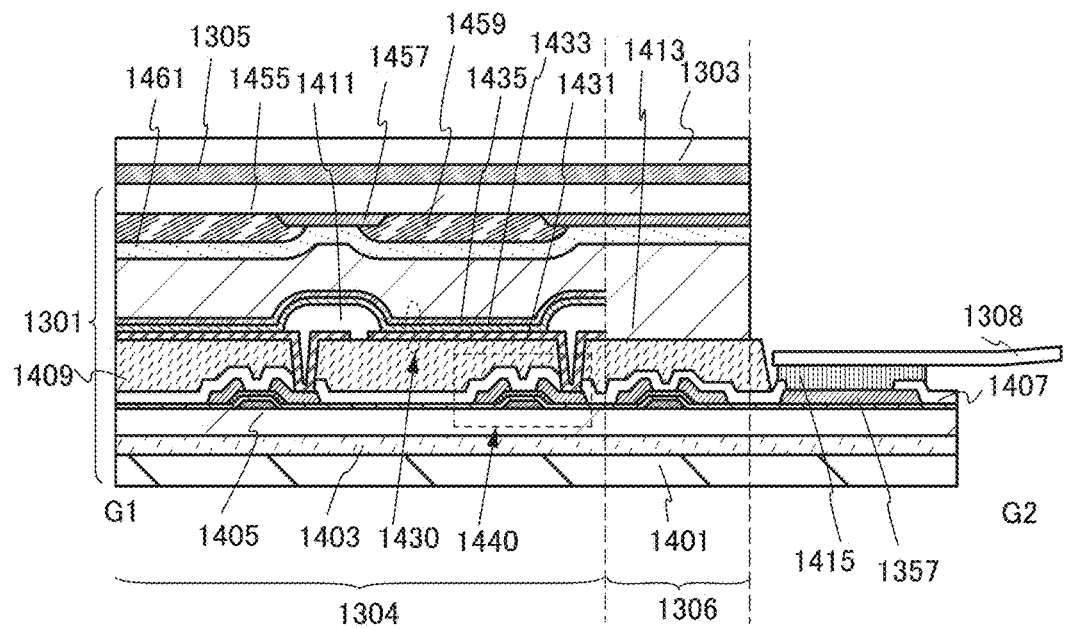
FIGS. 22A and 22B each illustrate a light-emitting panel.
Figure 22B:
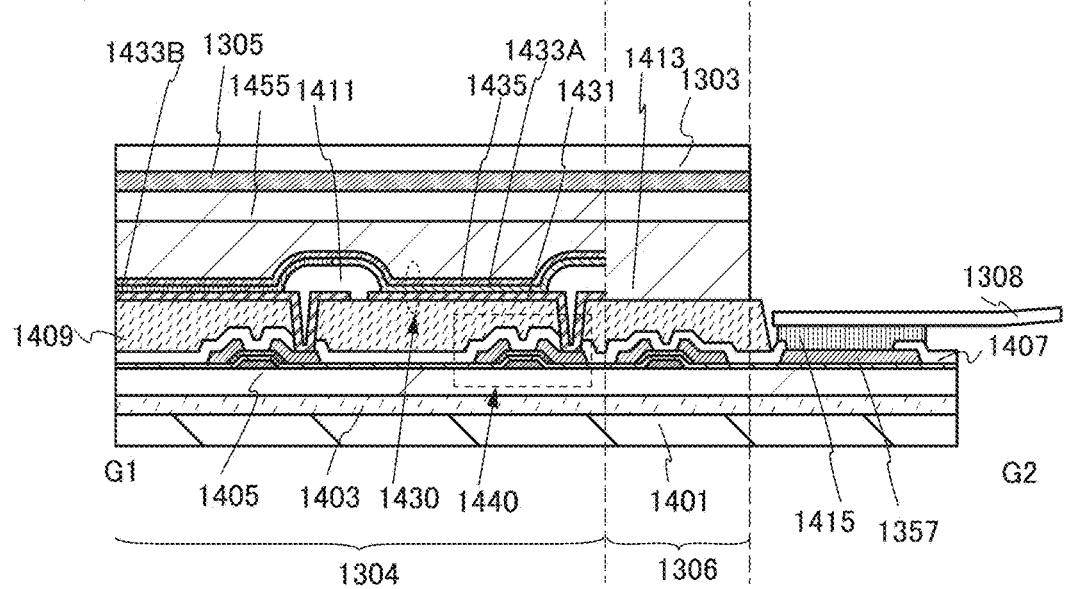

FIG. 18A is a plan view of a flexible light-emitting panel, and FIG. 18B is an example of a cross-sectional view taken along dashed-dotted line G1-G2 in FIG. 18A. In addition, examples of another cross-sectional view are illustrated in FIGS. 22A and 22B.

The light-emitting panel illustrated in FIG. 18B includes an element layer 1301, an adhesive layer 1305, and a substrate 1303. The element layer 1301 includes a substrate 1401, an adhesive layer 1403, an insulating layer 1405, a transistor 1440, a conductive layer 1357, an insulating layer 1407, an insulating layer 1409, a light-emitting element 1430, an insulating layer 1411, a sealing layer 1413, an insulating layer 1461, a coloring layer 1459, a light-blocking layer 1457, and an insulating layer 1455.

The conductive layer 1357 is electrically connected to an FPC 1308 via a connector 1415.

The light-emitting element 1430 includes a lower electrode 1431, an EL layer 1433, and an upper electrode 1435. The lower electrode 1431 is electrically connected to a source electrode or a drain electrode of the transistor 1440. An end portion of the lower electrode 1431 is covered with the insulating layer 1411. The light-emitting element 1430 has a top emission structure. The upper electrode 1435 has a light-transmitting property and transmits light emitted from the EL layer 1433.

Note that as illustrated in FIG. 22B, with the use of an EL layer 1433A and an EL layer 1433B, the EL layers may be separately provided for each pixel. In this case, different colors are emitted in the pixels; therefore, the coloring layer 1459 is not necessarily provided.

The coloring layer 1459 is provided to overlap with the light-emitting element 1430, and the light-blocking layer 1457 is provided to overlap with the insulating layer 1411. The coloring layer 1459 and the light-blocking layer 1457 are covered with the insulating layer 1461. A space between the light-emitting element 1430 and the insulating layer 1461 is filled with the sealing layer 1413.

The light-emitting panel includes a plurality of transistors in a light extraction portion 1304 and a driver circuit portion 1306. The transistor 1440 is provided over the insulating layer 1405. The insulating layer 1405 and the substrate 1401 are attached to each other with the adhesive layer 1403. The insulating layer 1455 and the substrate 1303 are attached to each other with the adhesive layer 1305. It is preferable to use films with low water permeability for the insulating layer 1405 and the insulating layer 1455, in which case an impurity such as water can be prevented from entering the light-emitting element 1430 or the transistor 1440, leading to improved reliability of the light-emitting panel. The adhesive layer 1403 can be formed using a material similar to that of the adhesive layer 1305.

The light-emitting panel in Specific Example 1 can be manufactured in the following manner: the insulating layer 1405, the transistor 1440, and the light-emitting element 1430 are formed over a formation substrate with high heat resistance; the formation substrate is separated; and the insulating layer 1405, the transistor 1440, and the light-emitting element 1430 are transferred to the substrate 1401 and attached thereto with the adhesive layer 1403. The light-emitting panel in Specific Example 1 can be manufactured in the following manner: the insulating layer 1455, the coloring layer 1459, and the light-blocking layer 1457 are formed over a formation substrate with high heat resistance; the formation substrate is separated; and the insulating layer 1455, the coloring layer 1459, and the light-blocking layer 1457 are transferred to the substrate 1303 and attached thereto with the adhesive layer 1305.

In the case where a material with high water permeability and low heat resistance (e.g., resin) is used for a substrate, it is impossible to expose the substrate to high temperature in the manufacturing process. Thus, there is a limitation on conditions for forming a transistor and an insulating film over the substrate. In the manufacturing method of this embodiment, a transistor and the like can be formed over a formation substrate having high heat resistance; thus, a highly reliable transistor and an insulating film with sufficiently low water permeability can be formed. Then, the transistor and the insulating film are transferred to the substrate 1303 or the substrate 1401, whereby a highly reliable light-emitting panel can be manufactured. Thus, with one embodiment of the present invention, a thin or/and lightweight light-emitting device with high reliability can be provided. Details of the manufacturing method will be described later.

The substrate 1303 and the substrate 1401 are each preferably formed using a material with high toughness. Thus, a display device with high impact resistance that is less likely to be broken can be provided. For example, when the substrate 1303 is an organic resin substrate and the substrate 1401 is a substrate formed using a thin metal material or a thin alloy material, a light-emitting panel that is more lightweight and less likely to be broken as compared with the case where a glass substrate is used can be provided.

A metal material and an alloy material, which have high thermal conductivity, are preferred because they can easily conduct heat to the whole substrate and accordingly can prevent a local temperature rise in the light-emitting panel. The thickness of a substrate using a metal material or an alloy material is preferably greater than or equal to 10 μm and less than or equal to 200 μm, further preferably greater than or equal to 20 μm and less than or equal to 50 μm.

Further, when a material with high thermal emissivity is used for the substrate 1401, the surface temperature of the light-emitting panel can be prevented from rising, leading to prevention of breakage or a decrease in reliability of the light-emitting panel. For example, the substrate 1401 may have a stacked-layer structure of a metal substrate and a layer with high thermal emissivity (the layer can be formed using a metal oxide or a ceramic material, for example).

Specific Example 2

Figure 19A:
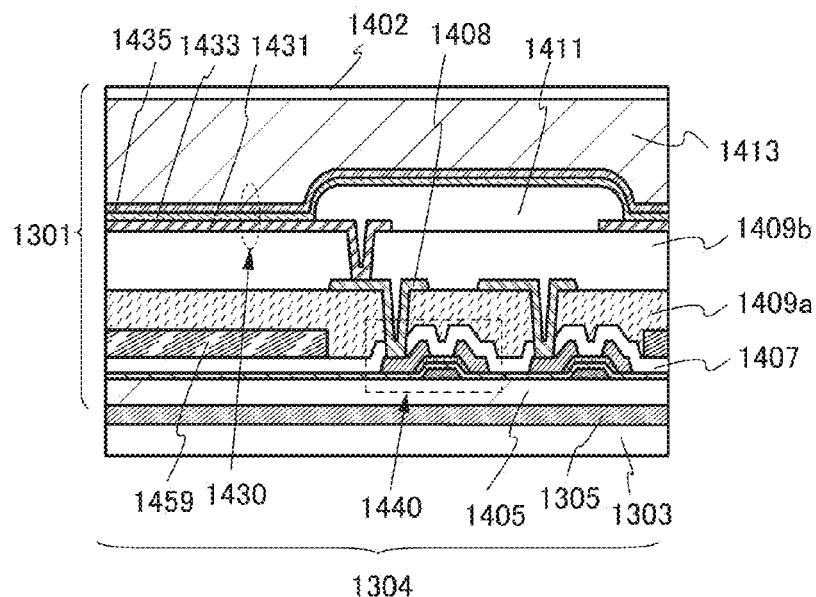
FIGS. 19A and 19B illustrate a light-emitting panel.

FIG. 19A illustrates another example of the light extraction portion 1304 in the light-emitting panel.

The light extraction portion 1304 illustrated in FIG. 19A includes the substrate 1303, the adhesive layer 1305, a substrate 1402, the insulating layer 1405, the transistor 1440, the insulating layer 1407, a conductive layer 1408, an insulating layer 1409a, an insulating layer 1409b, the light-emitting element 1430, the insulating layer 1411, the sealing layer 1413, and the coloring layer 1459.

The light-emitting element 1430 includes the lower electrode 1431, the EL layer 1433, and the upper electrode 1435. The lower electrode 1431 is electrically connected to the source electrode or the drain electrode of the transistor 1440 via the conductive layer 1408. An end portion of the lower electrode 1431 is covered with the insulating layer 1411. The light-emitting element 1430 has a bottom emission structure. The lower electrode 1431 has a light-transmitting property and transmits light emitted from the EL layer 1433.

The coloring layer 1459 is provided to overlap with the light-emitting element 1430, and light emitted from the light-emitting element 1430 is extracted from the substrate 1303 side through the coloring layer 1459. A space between the light-emitting element 1430 and the substrate 1402 is filled with the sealing layer 1413. The substrate 1402 can be formed using a material similar to that of the substrate 1401.

Specific Example 3

Figure 19B:
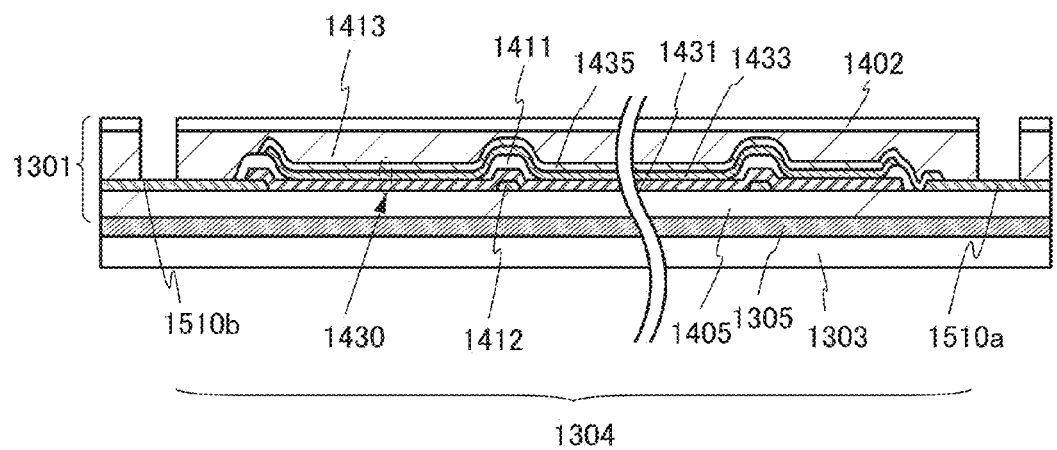

FIG. 19B illustrates another example of the light-emitting panel.

The light-emitting panel illustrated in FIG. 19B includes the element layer 1301, the adhesive layer 1305, and the substrate 1303. The element layer 1301 includes the substrate 1402, the insulating layer 1405, a conductive layer 1510a, a conductive layer 1510b, a plurality of light-emitting elements, the insulating layer 1411, a conductive layer 1412, and the sealing layer 1413.

The conductive layer 1510a and the conductive layer 1510b, which are external connection electrodes of the light-emitting panel, can each be electrically connected to an FPC or the like.

The light-emitting element 1430 includes the lower electrode 1431, the EL layer 1433, and the upper electrode 1435. An end portion of the lower electrode 1431 is covered with the insulating layer 1411. The light-emitting element 1430 has a bottom emission structure. The lower electrode 1431 has a light-transmitting property and transmits light emitted from the EL layer 1433. The conductive layer 1412 is electrically connected to the lower electrode 1431.

The substrate 1303 may have, as a light extraction structure, a hemispherical lens, a micro lens array, a film provided with an uneven surface structure, a light diffusing film, or the like. For example, a light extraction structure can be formed by attaching the above lens or film to a resin substrate with an adhesive or the like having substantially the same refractive index as the substrate or the lens or film.

The conductive layer 1412 is preferably, though not necessarily, provided because voltage drop due to the resistance of the lower electrode 1431 can be inhibited. In addition, for a similar purpose, a conductive layer electrically connected to the upper electrode 1435 may be provided over the insulating layer 1411.

The conductive layer 1412 can be a single layer or a stacked layer formed using a material selected from copper, titanium, tantalum, tungsten, molybdenum, chromium, neodymium, scandium, nickel, or aluminum, an alloy material containing any of these materials as its main component, or the like. The thickness of the conductive layer 1412 can be greater than or equal to 0.1 μm and less than or equal to 3 μm, preferably greater than or equal to 0.1 μm and less than or equal to 0.5 μm.

When a paste (e.g., silver paste) is used as a material for the conductive layer electrically connected to the upper electrode 1435, metal particles forming the conductive layer aggregate; therefore, the surface of the conductive layer is rough and has many gaps. Thus, it is difficult for the EL layer 1433 to completely cover the conductive layer; accordingly, the upper electrode and the conductive layer are electrically connected to each other easily, which is preferable.

<Examples of Materials>

Next, materials and the like that can be used for the light-emitting panel are described. Note that description of the components already described in this embodiment is omitted.

The element layer 1301 includes at least a light-emitting element. As the light-emitting element, a self-luminous element can be used, and an element whose luminance is controlled by current or voltage is included in the category of the light-emitting element. For example, a light-emitting diode (LED), an organic EL element, an inorganic EL element, or the like can be used.

The element layer 1301 may further include a transistor for driving the light-emitting element, a touch sensor, or the like.

The structure of the transistors in the light-emitting panel is not particularly limited. For example, a forward staggered transistor or an inverted staggered transistor may be used. A top-gate transistor or a bottom-gate transistor may be used. A semiconductor material used for the transistors is not particularly limited, and for example, silicon or germanium can be used. Alternatively, an oxide semiconductor containing at least one of indium, gallium, and zinc, such as an In—Ga—Zn-based metal oxide, may be used.

There is no particular limitation on the state of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. It is preferable that a semiconductor having crystallinity be particularly used, in which case deterioration of the transistor characteristics can be suppressed.

The light-emitting element included in the light-emitting panel includes a pair of electrodes (the lower electrode 1431 and the upper electrode 1435); and the EL layer 1433 between the pair of electrodes. One of the pair of electrodes functions as an anode and the other functions as a cathode.

The light-emitting element may have any of a top emission structure, a bottom emission structure, and a dual emission structure. A conductive film that transmits visible light is used as the electrode through which light is extracted. A conductive film that reflects visible light is preferably used as the electrode through which light is not extracted.

The conductive film that transmits visible light can be formed using, for example, indium oxide, indium tin oxide (ITO), indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium, an alloy containing any of these metal materials; or a nitride of any of these metal materials (e.g., titanium nitride) can be formed thin so as to have a light-transmitting property. Alternatively, a stack of any of the above materials can be used as the conductive film. For example, a stacked film of ITO and an alloy of silver and magnesium is preferably used, in which case conductivity can be increased. Further alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy containing any of these metal materials can be used. Lanthanum, neodymium, germanium, or the like may be added to the metal material or the alloy. An alloy containing aluminum (an aluminum alloy) such as an alloy of aluminum and titanium, an alloy of aluminum and nickel, or an alloy of aluminum and neodymium or an alloy containing silver such as an alloy of silver and copper, an alloy of silver, palladium, and, copper or an alloy of silver and magnesium can be used for the conductive film. An alloy of silver and copper is preferable because of its high heat resistance. Furthermore, when a metal film or a metal oxide film is stacked in contact with an aluminum alloy film, oxidation of the aluminum alloy film can be inhibited. Examples of a material for the metal film or the metal oxide film are titanium and titanium oxide. Alternatively, the above conductive film that transmits visible light and a film containing a metal material may be stacked. For example, a stacked film of silver and ITO or a stacked film of an alloy of silver and magnesium and ITO can be used.

Each of the electrodes can be formed by an evaporation method or a sputtering method. Alternatively, a discharging method such as an inkjet method, a printing method such as a screen printing method, or a plating method may be used.

When a voltage higher than the threshold voltage of the light-emitting element is applied between the lower electrode 1431 and the upper electrode 1435, holes are injected to the EL layer 1433 from the anode side and electrons are injected to the EL layer 1433 from the cathode side. The injected electrons and holes are recombined in the EL layer 1433 and a light-emitting substance contained in the EL layer 1433 emits light.

The EL layer 1433 includes at least a light-emitting layer. In addition to the light-emitting layer, the EL layer 1433 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron-transport property and a hole-transport property), and the like.

For the EL layer 1433, either a low molecular compound or a high molecular compound can be used, and an inorganic compound may also be used. Each of the layers included in the EL layer 1433 can be formed by any of the following methods: an evaporation method (including a vacuum evaporation method), a transfer method, a printing method, an inkjet method, a coating method, and the like.

In the element layer 1301, the light-emitting element is preferably provided between a pair of insulating films with low water permeability. Thus, an impurity such as water can be inhibited from entering the light-emitting element, leading to inhibition of a decrease in the reliability of the light-emitting device.

As an insulating film with low water permeability, a film containing nitrogen and silicon (e.g., a silicon nitride film or a silicon nitride oxide film), a film containing nitrogen and aluminum (e.g., an aluminum nitride film), or the like can be used. Alternatively, a silicon oxide film, a silicon oxynitride film, an aluminum oxide film, or the like can be used.

For example, the water vapor transmittance of the insulating film with low water permeability is lower than or equal to $1 \times 10^{-5}$ [g/m$^2$·day], preferably lower than or equal to $1 \times 10^{-6}$ [g/m$^2$·day], further preferably lower than or equal to $1 \times 10^{-7}$ [g/m$^2$·day], still further preferably lower than or equal to $1 \times 10^{-8}$ [g/m$^2$·day].

The substrate 1303 has a light-transmitting property and transmits at least light emitted from the light-emitting element included in the element layer 1301. The substrate 1303 has flexibility. The refractive index of the substrate 1303 is higher than that of the air.

An organic resin, which has a specific gravity smaller than that of glass, is preferably used for the substrate 1303, in which case the light-emitting device can be more lightweight as compared with the case where glass is used.

Examples of a material having flexibility and a light-transmitting property with respect to visible light include glass that is thin enough to have flexibility, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, and a polyvinyl chloride resin. In particular, a material whose thermal expansion coefficient is low is preferred, and for example, a polyamide imide resin, a polyimide resin, or PET can be suitably used. A substrate in which a glass fiber is impregnated with an organic resin or a substrate whose thermal expansion coefficient is reduced by mixing an organic resin with an inorganic filler can also be used.

The substrate 1303 may have a stacked-layer structure of a layer of any of the above-described materials and a hard coat layer (e.g., a silicon nitride layer) which protects a surface of the light-emitting device from damage or the like, a layer (e.g., an aramid resin layer) which can disperse pressure, or the like. Furthermore, to suppress a decrease in the lifetime of the light-emitting element due to moisture and the like, the insulating film with low water permeability may be included in the stacked structure.

The adhesive layer 1305 has a light-transmitting property and transmits at least light emitted from the light-emitting element included in the element layer 1301. The refractive index of the adhesive layer 1305 is higher than that of the air.

For the adhesive layer 1305, a resin that is curable at room temperature (e.g., a two-component-mixture-type resin), a light curable resin, a thermosetting resin, or the like can be used. Examples of such resins include an epoxy resin, an acrylic resin, a silicone resin, and a phenol resin. In particular, a material with low moisture permeability, such as an epoxy resin, is preferred.

The resin may include a drying agent. For example, a substance that adsorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can inhibit an impurity such as moisture from entering the light-emitting element, thereby improving the reliability of the light-emitting device.

In addition, it is preferable to mix a filler with a high refractive index (e.g., titanium oxide) into the resin, in which case the efficiency of light extraction from the light-emitting element can be improved.

The adhesive layer 1305 may also include a scattering member for scattering light. For example, the adhesive layer 1305 can be a mixture of the above-described resin and particles having a refractive index different from that of the resin. The particles function as the scattering member for scattering light.

The difference in refractive index between the resin and the particles with a refractive index different from that of the resin is preferably 0.1 or more, further preferably 0.3 or more. Specifically, an epoxy resin, an acrylic resin, an imide resin, a silicone resin, or the like can be used as the resin, and titanium oxide, barium oxide, zeolite, or the like can be used as the particles.

Particles of titanium oxide or barium oxide are preferable because they scatter light excellently. When zeolite is used, it can adsorb water contained in the resin and the like, thereby improving the reliability of the light-emitting element.

The insulating layer 1405 and the insulating layer 1455 can each be formed using an inorganic insulating material. It is particularly preferable to use the insulating film with low water permeability, in which case a highly reliable light-emitting panel can be provided.

The insulating layer 1407 has an effect of inhibiting diffusion of impurities into a semiconductor included in the transistor. As the insulating layer 1407, an inorganic insulating film such as a silicon oxide film, a silicon oxynitride film, or an aluminum oxide film can be used.

As each of the insulating layers 1409, 1409a, and 1409b, an insulating film with a planarization function is preferably selected in order to reduce surface unevenness due to the transistor or the like. For example, an organic material such as a polyimide resin, an acrylic resin, or a benzocyclobutene-based resin can be used. Other than such organic materials, it is also possible to use a low-dielectric constant material (a low-k material) or the like. Note that a plurality of insulating films formed of these materials or inorganic insulating films may be stacked.

The insulating layer 1411 is provided to cover an end portion of the lower electrode 1431. In order that the insulating layer 1411 be favorably covered with the EL layer 1433 and the upper electrode 1435 formed thereover, a side wall of the insulating layer 1411 preferably has a tilted surface with continuous curvature.

As a material for the insulating layer 1411, a resin or an inorganic insulating material can be used. As the resin, for example, a polyimide resin, a polyamide resin, an acrylic resin, a siloxane resin, an epoxy resin, or a phenol resin can be used. In particular, either a negative photosensitive resin or a positive photosensitive resin is preferably used for easy formation of the insulating layer 1411.

There is no particular limitation on the method for forming the insulating layer 1411; a photolithography method, a sputtering method, an evaporation method, a droplet discharging method (e.g., an inkjet method), a printing method (e.g., a screen printing method or an off-set printing method), or the like may be used.

For the sealing layer 1413, a resin that is curable at room temperature (e.g., a two-component-mixture-type resin), a light curable resin, a thermosetting resin, or the like can be used. For example, a polyvinyl chloride (PVC) resin, an acrylic resin, a polyimide resin, an epoxy resin, a silicone resin, a polyvinyl butyral (PVB) resin, an ethylene vinyl acetate (EVA) resin, or the like can be used. A drying agent may be contained in the sealing layer 1413. In the case where light emitted from the light-emitting element 1430 is extracted outside through the sealing layer 1413, the sealing layer 1413 preferably includes a filler with a high refractive index or a scattering member. Materials for the drying agent, the filler with a high refractive index, and the scattering member are similar to those that can be used for the adhesive layer 1305.

The conductive layer 1357 can be formed using the same material and the same step as a conductive layer included in the transistor or the light-emitting element. For example, the conductive layer can be formed to have a single-layer structure or a stacked-layer structure using any of metal materials such as molybdenum, titanium, chromium, tantalum, tungsten, aluminum, copper, neodymium, and scandium, and an alloy material containing any of these elements. Each of the conductive layers may be formed using a conductive metal oxide. As the conductive metal oxide, indium oxide (e.g., $In_2O_3$), tin oxide (e.g., $SnO_2$), zinc oxide (ZnO), ITO, indium zinc oxide (e.g., $In_2O_3$—ZnO), or any of these metal oxide materials in which silicon oxide is contained can be used.

Each of the conductive layers 1408, 1412, 1510a, and 1510b can also be formed using any of the above-described metal materials, alloy materials, and conductive metal oxides.

For the connector 1415, it is possible to use a paste-like or sheet-like material which is obtained by mixture of metal particles and a thermosetting resin and for which anisotropic electric conductivity is provided by thermocompression bonding. As the metal particles, particles in which two or more kinds of metals are layered, for example, nickel particles coated with gold are preferably used.

The coloring layer 1459 is a colored layer that transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used. Each coloring layer is formed in a desired position with any of various materials by a printing method, an inkjet method, an etching method using a photolithography method, or the like.

The light-blocking layer 1457 is provided between the adjacent coloring layers 1459. The light-blocking layer 1457 blocks light emitted from the adjacent light-emitting element, thereby inhibiting color mixture between adjacent pixels. Here, the coloring layer 1459 is provided such that its end portion overlaps with the light-blocking layer 1457, whereby light leakage can be reduced. The light-blocking layer 1457 can be formed using a material that blocks light emitted from the light-emitting element, for example, a metal material, a resin material including a pigment or a dye, or the like. Note that the light-blocking layer 1457 is preferably provided in a region other than the light extraction portion 1304, such as the driver circuit portion 1306, as illustrated in FIG. 18B, in which case undesired leakage of guided light or the like can be inhibited.

The insulating layer 1461 covering the coloring layer 1459 and the light-blocking layer 1457 is preferably provided because it can inhibit an impurity such as a pigment included in the coloring layer 1459 or the light-blocking layer 1457 from diffusing into the light-emitting element or the like. For the insulating layer 1461, a light-transmitting material is used, and an inorganic insulating material or an organic insulating material can be used. The insulating film with low water permeability may be used for the insulating layer 1461.

<Manufacturing Method Example>

Next, an example of a method for manufacturing a light-emitting device will be described with reference to FIGS. 20A to 20C and FIGS. 21A to 21C. Here, the manufacturing method is described using the light-emitting device of Specific Example 1 (FIG. 18B) as an example.

First, a separation layer 1503 is formed over a formation substrate 1501, and the insulating layer 1405 is formed over the separation layer 1503. Next, the transistor 1440, the conductive layer 1357, the insulating layer 1407, the insulating layer 1409, the light-emitting element 1430, and the insulating layer 1411 are formed over the insulating layer 1405. An opening is formed in the insulating layers 1411, 1409, and 1407 to expose the conductive layer 1357 (see FIG. 20A).

In addition, a separation layer 1507 is formed over a formation substrate 1505, and the insulating layer 1455 is formed over the separation layer 1507. Next, the light-blocking layer 1457, the coloring layer 1459, and the insulating layer 1461 are formed over the insulating layer 1455 (see FIG. 20B).

Here, the formation substrate 1501 corresponds to one of the substrate 210 and the substrate 220 in Embodiment 1, and the formation substrate 1505 corresponds to the other of the substrate 210 and the substrate 220.

The formation substrate 1501 and the formation substrate 1505 can each be a glass substrate, a quartz substrate, a sapphire substrate, a ceramic substrate, a metal substrate, or the like.

For the glass substrate, for example, a glass material such as aluminosilicate glass, aluminoborosilicate glass, or barium borosilicate glass can be used. When the temperature of heat treatment performed later is high, a substrate having a strain point of 730° C. or higher is preferably used. Alternatively, crystallized glass or the like may be used.

In the case where a glass substrate is used as the formation substrate, an insulating film such as a silicon oxide film, a silicon oxynitride film, a silicon nitride film, or a silicon nitride oxide film is preferably formed between the formation substrate and the separation layer, in which case contamination from the glass substrate can be prevented.

The separation layer 1503 and the separation layer 1507 each have a single-layer structure or a stacked-layer structure containing an element selected from tungsten, molybdenum, titanium, tantalum, niobium, nickel, cobalt, zirconium, zinc, ruthenium, rhodium, palladium, osmium, iridium, and silicon; an alloy material containing any of the elements; or a compound material containing any of the elements. A crystal structure of a layer containing silicon may be amorphous, microcrystal, or polycrystal.

The separation layer can be formed by a sputtering method, a plasma CVD method, a coating method, a printing method, or the like. Note that a coating method includes a spin coating method, a droplet discharge method, and a dispensing method.

In the case where the separation layer has a single-layer structure, a tungsten layer, a molybdenum layer, or a layer containing a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum may be formed. Note that the mixture of tungsten and molybdenum corresponds to an alloy of tungsten and molybdenum, for example.

In the case where the separation layer is formed to have a stacked-layer structure including a layer containing tungsten and a layer containing an oxide of tungsten, the layer containing an oxide of tungsten may be formed as follows: the layer containing tungsten is formed first and an insulating film formed of an oxide is formed thereover, so that the layer containing an oxide of tungsten is formed at the interface between the tungsten layer and the insulating film. Alternatively, the layer containing an oxide of tungsten may be formed by performing thermal oxidation treatment, oxygen plasma treatment, nitrous oxide ($N_2O$) plasma treatment, treatment with a highly oxidizing solution such as ozone water, or the like on the surface of the layer containing tungsten. Plasma treatment or heat treatment may be performed in an atmosphere of oxygen, nitrogen, or nitrous oxide alone, or a mixed gas of any of these gasses and another gas. Surface condition of the separation layer is changed by the plasma treatment or heat treatment, whereby adhesion between the separation layer and the insulating layer formed later can be controlled.

Each of the insulating layers can be formed by a sputtering method, a plasma CVD method, a coating method, a printing method, or the like. For example, the insulating layer is formed at higher than or equal to 250° C. and lower than or equal to 400° C. by a plasma CVD method, whereby the insulating layer can be a dense film with very low water permeability.

Figure 20A:
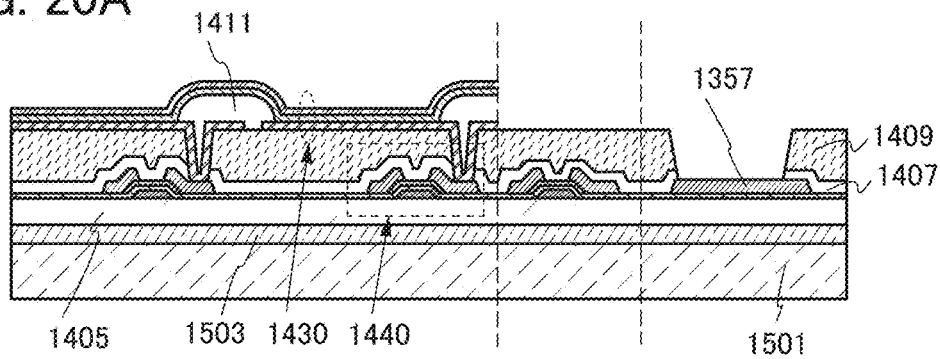
FIGS. 20A to 20C illustrate a method for manufacturing a light-emitting panel.
Figure 20B:
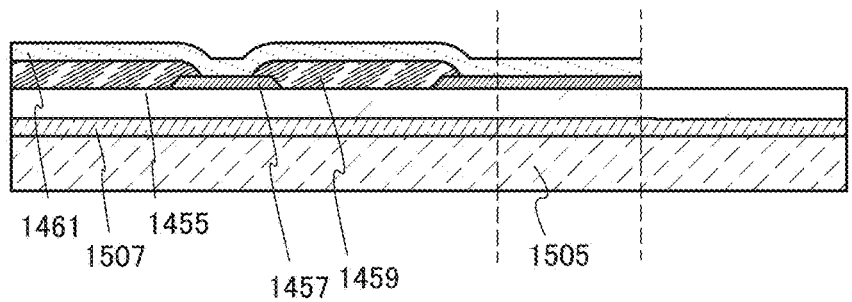
Figure 20C:
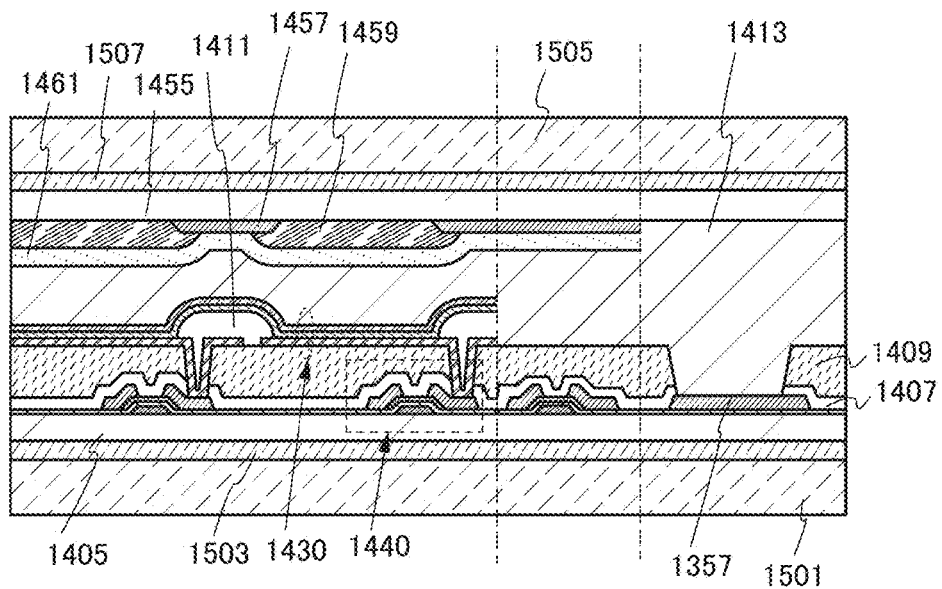

Then, a material for the sealing layer 1413 is applied to a surface of the formation substrate 1505 over which the coloring layer 1459 and the like are formed or a surface of the formation substrate 1501 over which the light-emitting element 1430 and the like are formed, and the formation substrate 1501 and the formation substrate 1505 are attached to each other with the sealing layer 1413 positioned therebetween (see FIG. 20C).

Next, the formation substrate 1501 is separated, and the exposed insulating layer 1405 and the substrate 1401 are attached to each other with the adhesion layer 1403. Furthermore, the formation substrate 1505 is separated, and the exposed insulating layer 1455 and the substrate 1303 are attached to each other with the adhesive layer 1305. Although the substrate 1303 does not overlap with the conductive layer 1357 in FIG. 21A, the substrate 1303 may overlap with the conductive layer 1357.

The separation step of the formation substrate 1501 or the formation substrate 1505 can be performed with the stack processing apparatus described in Embodiment 1. In addition, the step of separating the formation substrate 1501, the step of attaching the substrate 1401, the step of separating the formation substrate 1505, and the step of attaching the substrate 1303 can be performed with any of the stack processing apparatuses described in Embodiments 2 to 4.

Note that in the separation step using any of the stack processing apparatuses that are embodiments of the present invention, various separation methods can be performed on the formation substrate. For example, when a layer including a metal oxide film is formed as the separation layer on the side in contact with the layer to be separated, the metal oxide film is embrittled by crystallization, whereby the layer to be separated can be separated from the formation substrate. Alternatively, when an amorphous silicon film containing hydrogen is formed as the separation layer between the formation substrate having high heat resistance and the layer to be separated, the amorphous silicon film is removed by laser light irradiation or etching, whereby the layer to be separated can be separated from the formation substrate. Alternatively, after a layer including a metal oxide film is formed as the separation layer on the side in contact with the layer to be separated, the metal oxide film is embrittled by crystallization, and part of the separation layer is removed by etching using a solution or a fluoride gas such as $NF_3$, $BrF_3$, or $ClF_3$, whereby the separation can be performed at the embrittled metal oxide film. Furthermore, a method may be used in which a film containing nitrogen, oxygen, hydrogen, or the like (for example, an amorphous silicon film containing hydrogen, an alloy film containing hydrogen, an alloy film containing oxygen, or the like) is used as the separation layer, and the separation layer is irradiated with laser light to release the nitrogen, oxygen, or hydrogen contained in the separation layer as a gas, thereby promoting separation between the layer to be separated and the formation substrate. Alternatively, it is possible to use a method in which the formation substrate provided with the layer to be separated is removed mechanically or by etching using a solution or a fluoride gas such as $NF_3$, $BrF_3$, or $ClF_3$, or the like. In this case, the separation layer is not necessarily provided.

Furthermore, the separation step can be conducted easily by combination of the above-described separation methods. In other words, separation can be performed with physical force (by a machine or the like) after performing laser light irradiation, etching on the separation layer with a gas, a solution, or the like, or mechanical removal with a sharp knife, scalpel or the like so that the separation layer and the layer to be separated can be easily separated from each other. The step corresponds to the step of forming the separation starting point in this specification. The separation starting point is preferably formed in each of the processed member and the stack which are processed with any of the stack processing apparatuses that are embodiments of the present invention.

Separation of the layer to be separated from the formation substrate may be carried out by filling the interface between the separation layer and the layer to be separated with a liquid. Furthermore, the separation may be conducted while pouring a liquid such as water.

As another separation method, in the case where the separation layer is formed using tungsten, it is preferable that the separation be performed while etching the separation layer using a mixed solution of ammonium water and a hydrogen peroxide solution.

Note that the separation layer is not necessary in the case where separation at the interface between the formation substrate and the layer to be separated is possible. For example, glass is used as the formation substrate, an organic resin such as polyimide is formed in contact with the glass, and an insulating film, a transistor, and the like are formed over the organic resin. In this case, heating the organic resin enables the separation at the interface between the formation substrate and the organic resin. Alternatively, separation at the interface between a metal layer and the organic resin may be performed in the following manner: the metal layer is provided between the formation substrate and the organic resin and current is made to flow in the metal layer so that the metal layer is heated.

Figure 21A:
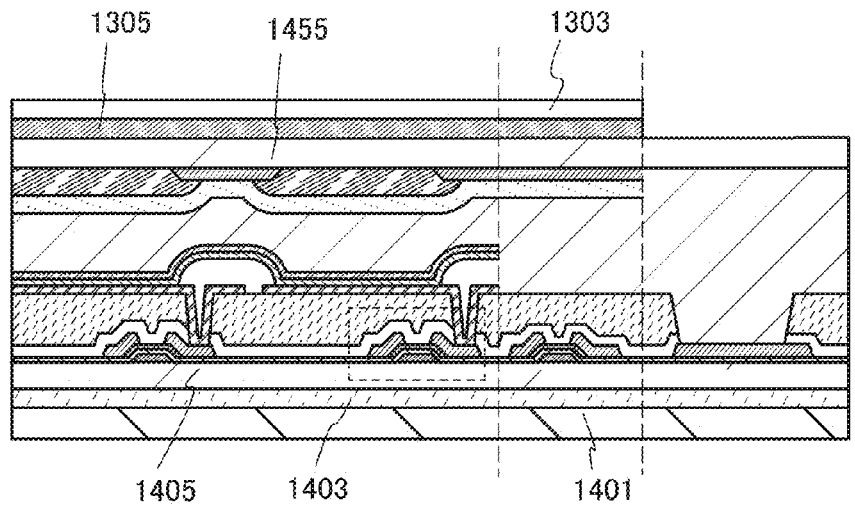
FIGS. 21A to 21C illustrate a method for manufacturing a light-emitting panel.
Figure 21B:
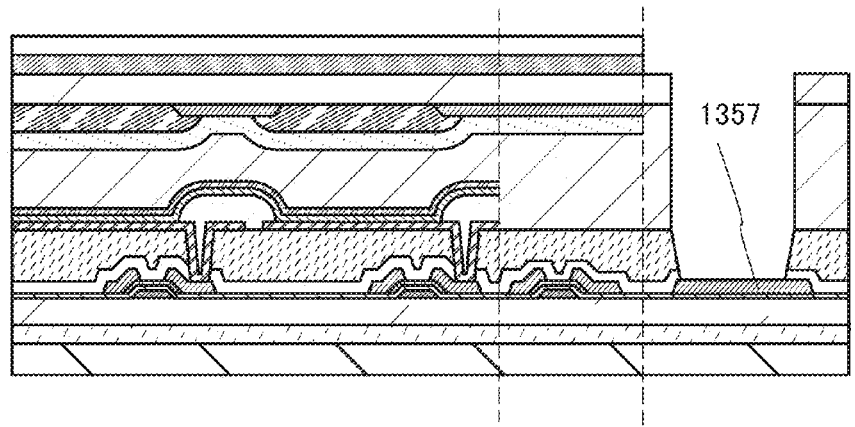
Figure 21C:
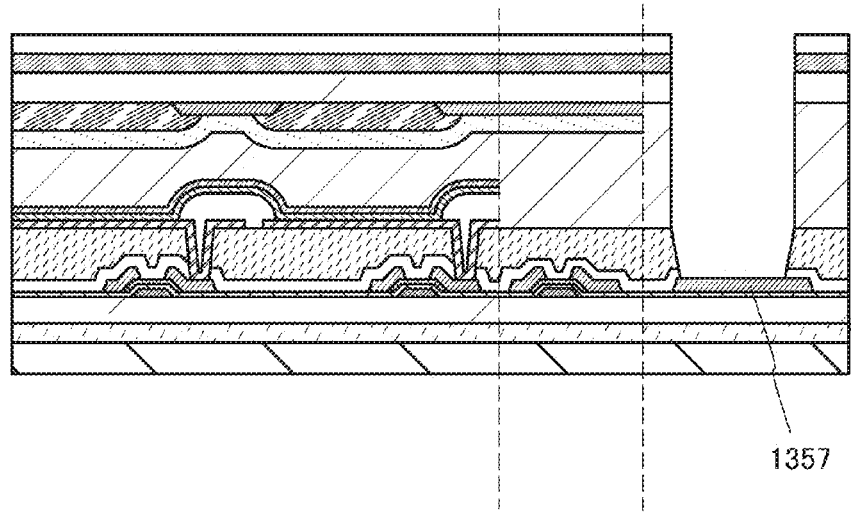

Lastly, an opening is formed in the insulating layer 1455 and the sealing layer 1413 to expose the conductive layer 1357 (see FIG. 21B). In the case where the substrate 1303 overlaps with the conductive layer 1357, the opening is formed also in the substrate 1303 and the adhesive layer 1305 (see FIG. 21C). The method for forming the opening is not particularly limited and may be, for example, a laser ablation method, an etching method, an ion beam sputtering method, or the like. As another method, a slit may be made in a film over the conductive layer 1357 with a sharp knife or the like and part of the film may be separated by physical force.

In the above-described manner, the light-emitting panel can be manufactured.

Figure 23:
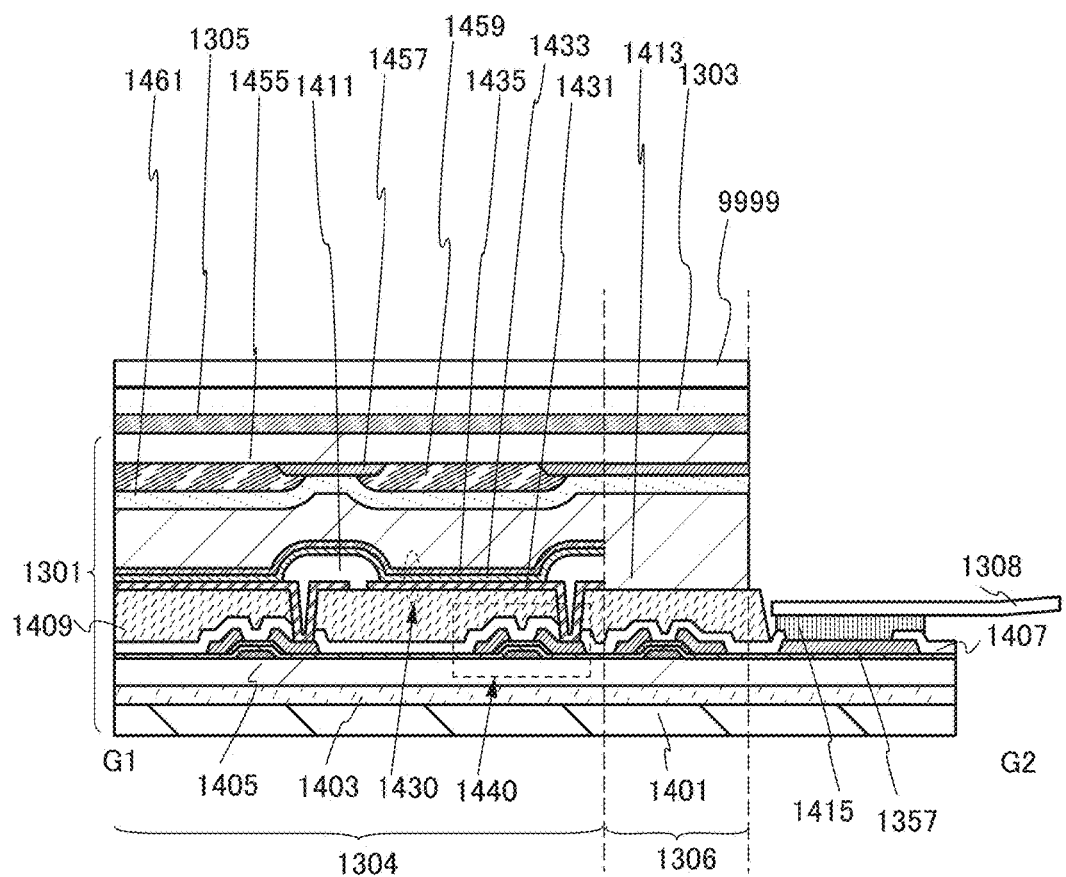
FIG. 23 illustrates a light-emitting panel.

Note that a touch sensor or a touch panel may be provided. For example, FIG. 23 illustrates a case where a touch panel 9999 is provided in the light-emitting panel in FIG. 22A. A touch sensor may be directly formed on the substrate 1303; alternatively, the touch panel 9999 formed on another substrate may be placed over the substrate 1303.

Note that although the case where the light-emitting element is used as a display element is illustrated here, one embodiment of the present invention is not limited thereto. Various display elements can be used. For example, in this specification and the like, a display element, a display device which is a device including a display element, a light-emitting element, and a light-emitting device which is a device including a light-emitting element can employ a variety of modes or can include a variety of elements. Examples of a display element, a display device, a light-emitting element, or a light-emitting device include an EL (electroluminescent) element (e.g., an EL element including organic and inorganic materials, an organic EL element, or an inorganic EL element), an LED (e.g., a white LED, a red LED, a green LED, or a blue LED), a transistor (a transistor which emits light depending on current), an electron emitter, a liquid crystal element, electronic ink, an electrophoretic element, a grating light valve (GLV), a plasma display panel (PDP), a micro electro mechanical system (MEMS), a digital micromirror device (DMD), a digital micro shutter (DMS), MIRASOL (registered trademark), an interferometric modulator display (IMOD) element, an electrowetting element, a piezoelectric ceramic display, or a carbon nanotube, which are display media whose contrast, luminance, reflectivity, transmittance, or the like is changed by electromagnetic action. Examples of display devices having EL elements include an EL display. Examples of a display device including an electron emitter include a field emission display (FED), an SED-type flat panel display (SED: surface-conduction electron-emitter display), and the like.

Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Display devices having electronic ink or electrophoretic elements include electronic paper and the like.

In this specification and the like, an active matrix method in which an active element is included in a pixel or a passive matrix method in which an active element is not included in a pixel can be used.

In an active matrix method, as an active element (a non-linear element), not only a transistor but also various active elements (non-linear elements) can be used. For example, a metal insulator metal (MIM), a thin film diode (TFD), or the like can also be used. Since such an element has few number of manufacturing steps, manufacturing cost can be reduced or yield can be improved. Alternatively, since the size of the element is small, the aperture ratio can be improved, so that power consumption can be reduced or higher luminance can be achieved.

As a method other than the active matrix method, the passive matrix method in which an active element (a non-linear element) is not used can also be used. Since an active element (a non-linear element) is not used, the number of manufacturing steps is small, so that manufacturing cost can be reduced or the yield can be improved. Alternatively, since an active element (a non-linear element) is not used, the aperture ratio can be improved, so that power consumption can be reduced or higher luminance can be achieved, for example.

As described above, a light-emitting panel of this embodiment includes two substrates; one is the substrate 1303 and the other is the substrate 1401. The light-emitting device can be formed with two substrates even when including a touch sensor. Owing to the use of the minimum number of substrates, improvement in light extraction efficiency and improvement in clarity of display can be easily achieved.

As examples of electronic devices including a display device with flexibility, the following can be given: television devices (also referred to as televisions or television receivers), monitors of computers or the like, cameras such as digital cameras or digital video cameras, digital photo frames, mobile phones (also referred to as mobile phones or mobile phone devices), portable game machines, portable information terminals, audio reproducing devices, large game machines such as pachinko machines, and the like.

In addition, a lighting device or a display device can be incorporated along a curved inside/outside wall surface of a house or a building or a curved interior/exterior surface of a car.

Figure 24A:
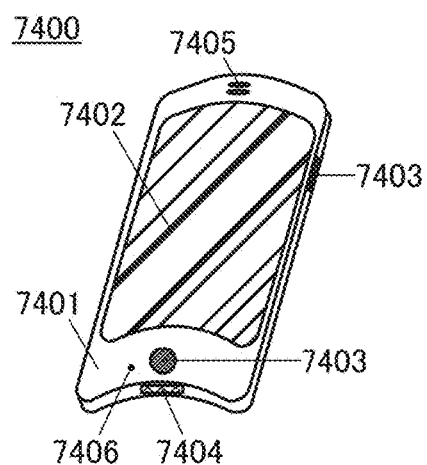
FIGS. 24A to 24D illustrate examples of electronic devices and lighting devices.

FIG. 24A illustrates an example of a mobile phone. A mobile phone 7400 is provided with a display portion 7402 incorporated in a housing 7401, an operation button 7403, an external connection port 7404, a speaker 7405, a microphone 7406, and the like. The mobile phone 7400 is fabricated using the display device for the display portion 7402.

When the display portion 7402 of the mobile phone 7400 illustrated in FIG. 24A is touched with a finger or the like, data can be input into the mobile phone 7400. Operations such as making a call and inputting a letter can be performed by touch on the display portion 7402 with a finger or the like.

With the operation button 7403, power ON or OFF can be switched. In addition, types of images displayed on the display portion 7402 can be switched; for example, switching images from a mail creation screen to a main menu screen is performed with the operation button 7403.

Here, the display portion 7402 includes a display device that can be fabricated by using one embodiment of the present invention. Thus, the mobile phone can have a curved display portion and high reliability.

Figure 24B:
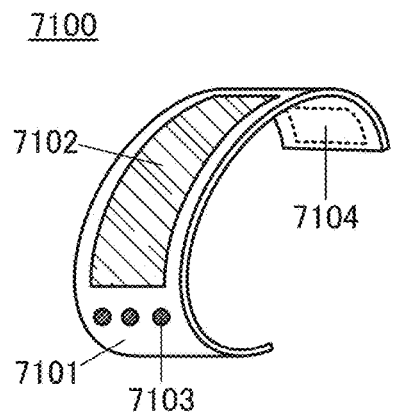

FIG. 24B is an example of a wristband-type display device. A portable display device 7100 includes a housing 7101, a display portion 7102, an operation button 7103, and a sending and receiving device 7104.

The portable display device 7100 can receive a video signal with the sending and receiving device 7104 and can display the received video on the display portion 7102. In addition, with the sending and receiving device 7104, the portable display device 7100 can send an audio signal to another receiving device.

With the operation button 7103, power ON/OFF, switching displayed videos, adjusting volume, and the like can be performed.

Here, the display portion 7102 includes a display device that can be fabricated by using one embodiment of the present invention. Thus, the portable display device can have a curved display portion and high reliability.

Figure 24C:
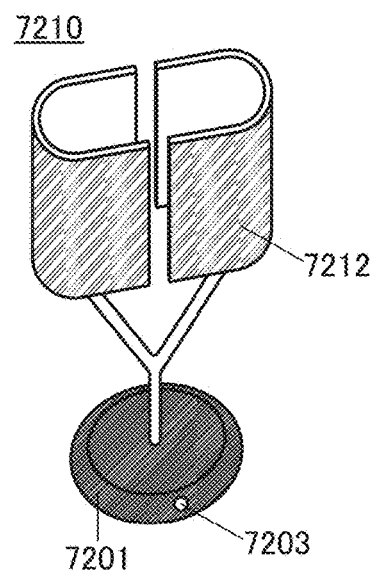
Figure 24D:
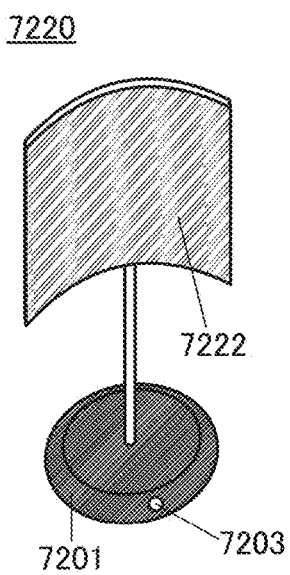

FIGS. 24C and 24D each illustrate an example of a lighting device. Lighting devices 7210 and 7220 each include a stage 7201 provided with an operation switch 7203 and a light-emitting portion supported by the stage 7201.

A light-emitting portion 7212 included in the lighting device 7210 illustrated in FIG. 24C has two convex-curved light-emitting portions symmetrically placed. Thus, all directions can be illuminated with the lighting device 7210 as a center.

The lighting device 7220 illustrated in FIG. 24D includes a concave-curved light-emitting portion 7222. This is suitable for illuminating a specific range because light emitted from the light-emitting portion 7222 is collected to the front of the lighting device 7220.

The light-emitting portion included in each of the lighting devices 7210 and 7220 is flexible; thus, the light-emitting portion may be fixed on a plastic member, a movable frame, or the like so that an emission surface of the light-emitting portion can be bent freely depending on the intended use.

The light-emitting portions included in the lighting devices 7210 and 7220 each include a display device that can be fabricated by using one embodiment of the present invention. Thus, the lighting devices can have curved display portions and high reliability.

Figure 25A:
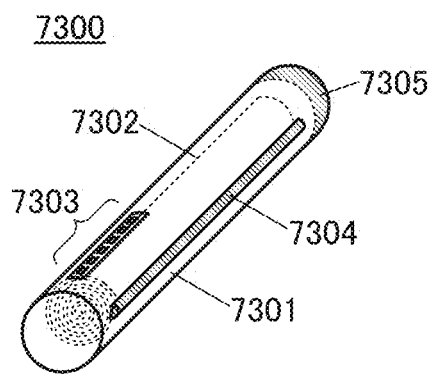
FIGS. 25A and 25B illustrate an example of an electronic device.

FIG. 25A illustrates an example of a portable display device. A display device 7300 includes a housing 7301, a display portion 7302, operation buttons 7303, a display portion pull 7304, and a control portion 7305.

The display device 7300 includes a rolled flexible display portion 7302 in the cylindrical housing 7301. The display portion 7302 includes a first substrate provided with a light-blocking layer and the like and a second substrate provided with a transistor and the like. The display portion 7302 is rolled so that the second substrate is positioned against an inner wall of the housing 7301.

The display device 7300 can receive a video signal with the control portion 7305 and can display the received video on the display portion 7302. In addition, a battery is included in the control portion 7305. Moreover, a connector may be included in the control portion 7305 so that a video signal or power can be supplied directly.

With the operation buttons 7303, power ON/OFF, switching of displayed videos, and the like can be performed.

Figure 25B:
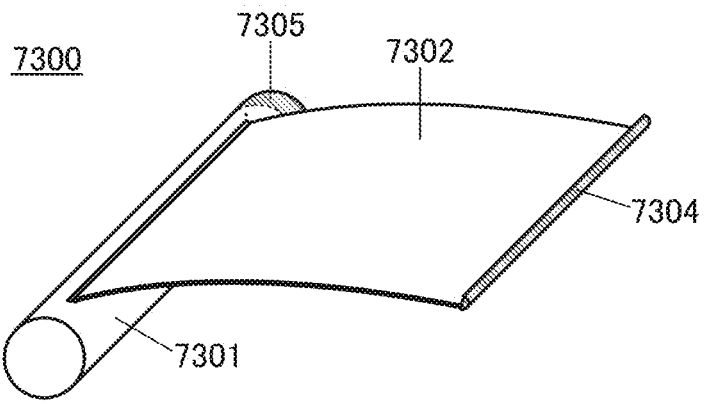

FIG. 25B illustrates a state in which the display portion 7302 is pulled out with the display portion pull 7304. Videos can be displayed on the display portion 7302 in this state. In addition, the operation buttons 7303 on the surface of the housing 7301 allow one-handed operation.

Note that a reinforcement frame may be provided for an edge portion of the display portion 7302 in order to prevent the display portion 7302 from being curved when pulled out.

Note that in addition to this structure, a speaker may be provided for the housing so that sound is output with an audio signal received together with a video signal.

The display portion 7302 includes a display device that can be fabricated by using one embodiment of the present invention. Thus, the display portion 7302 is a display device which is flexible and highly reliable, which makes the display device 7300 lightweight and highly reliable.

It is needless to say that one embodiment of the present invention is not limited to the above-described electronic devices and lighting devices as long as a display device that can be fabricated by using one embodiment of the present invention is included.

This embodiment can be implemented in an appropriate combination with any of the structures described in the other embodiments.

EXPLANATION OF REFERENCE

11: substrate, 12: separation layer, 13: layer to be separated, 13*s*: starting point, 21: substrate, 22: separation layer, 23: layer to be separated, 25: base, 30: bonding layer, 31: adhesive layer, 32: adhesive layer, 41: support, 41*b*: support, 42: support, 80: processed member, 80*a*: remaining portion, 80*b*: surface, 81: stack, 90: processed member, 90*a*: remaining portion, 90*b*: surface, 91: stack, 91*a*: remaining portion, 91*b*: surface, 91*s*: starting point, 92: stack, 100: loader unit, 111: conveying means, 112: conveying means, 200: processed member, 201: processed member, 210: substrate, 211: slit, 212: substrate, 215: flexible substrate, 220: substrate, 230: fixing stage, 231: fixing stage, 240: adsorption mechanism, 241: adsorption jig, 241*a*: adsorption jig, 242: vertical movement mechanism, 243: adsorption portion, 243*a*: inlet, 244: axis, 245: movable portion, 250: wedge-shaped jig, 251: needle, 255: sensor, 256: sensor, 260: component, 270: nozzle, 271: nozzle, 280: roller, 281: clamp jig, 291: direction, 292: direction, 293: direction, 300: separating unit, 300*b*: storage portion, 350: cleaning device, 400: attaching unit, 500: support feeding unit, 600: loader unit, 700: starting point forming unit, 800: separating unit, 800*b*: storage portion, 850: cleaning unit, 900: attaching unit, 1000: processing apparatus, 1000B: processing apparatus, 1240: adsorption mechanism, 1241: adsorption jig, 1241*a*: adsorption jig, 1241*b*: adsorption jig, 1242: vertical movement mechanism, 1243: adsorption portion, 1243*a*: inlet, 1244: axis, 1245: movable portion, 1301: element layer, 1303: substrate, 1304: portion, 1305: adhesive layer, 1306: driver circuit portion 1308: FPC, 1357: conductive layer, 1401: substrate, 1402: substrate, 1403: adhesive layer, 1405: insulating layer, 1407: insulating layer, 1408: conductive layer, 1409: insulating layer, 1409*a*: insulating layer, 1409*b*: insulating layer, 1411: insulating layer, 1412: conductive layer, 1413: sealing layer, 1415: connector, 1430: light-emitting element, 1431: lower electrode, 1433: EL layer, 1433A: EL layer, 1433B: EL layer, 1435: upper electrode, 1440: transistor, 1455: insulating layer, 1457: light-blocking layer, 1459: coloring layer, 1461: insulating layer, 1501: formation substrate, 1503: separation layer, 1505: formation substrate, 1507: separation layer, 1510*a*: conductive layer, 1510*b*: conductive layer, 7100: portable display device, 7101: housing, 7102: display portion, 7103: operation button, 7104: sending and receiving device, 7201: stage, 7203: operation switch, 7210: lighting device, 7212: light-emitting portion, 7220: lighting device, 7222: light-emitting portion, 7300: display device, 7301: housing, 7302: display portion, 7303: operation button, 7304: pull, 7305: control portion, 7400: mobile phone, 7401: housing, 7402: display portion, 7403: operation button, 7404: external connection port, 7405: speaker, 7406: microphone, and 9999: touch panel.

This application is based on Japanese Patent Application serial no. 2013-179217 filed with Japan Patent Office on Aug. 30, 2013; Japanese Patent Application serial no. 2013-179220 filed with Japan Patent Office on Aug. 30, 2013; Japanese Patent Application serial no. 2014-029422 filed with Japan Patent Office on Feb. 19, 2014; and Japanese Patent Application serial no. 2014-029423 filed with Japan Patent Office on Feb. 19, 2014 the entire contents of which are hereby incorporated by reference.

The invention claimed is:

1. A method for manufacturing a semiconductor device comprising the steps of:
fixing part of a stack to a fixing mechanism, the stack including a transistor;
attaching a first adsorption jig, a second adsorption jig and a third adsorption jig to a first periphery of the stack, and attaching a fourth adsorption jig, a fifth adsorption jig and a sixth adsorption jig to a second periphery of the stack;
moving the first adsorption jig, the second adsorption jig and the third adsorption jig so that a flexible substrate is partially separated from the stack;
fixing a first clamp jig to the flexible substrate at a position between the first adsorption jig and the second adsorption jig, and fixing a second clamp jig to the flexible substrate at a position between the second adsorption jig and the third adsorption jig; and
moving the first adsorption jig, the second adsorption jig, the third adsorption jig, the first clamp jig and the second clamp jig so that the flexible substrate is separated from the stack.

2. The method for manufacturing a semiconductor device according to claim 1, further comprising a step of making a slit to the stack by laser processing before fixing the part of the stack to the fixing mechanism.

3. The method for manufacturing a semiconductor device according to claim 1, wherein the first adsorption jig, the second adsorption jig and the third adsorption jig are moved in a different direction from the first clamp jig and the second clamp jig.

4. The method for manufacturing a semiconductor device according to claim 3, wherein the first adsorption jig, the second adsorption jig and the third adsorption jig are moved upward, and the first clamp jig and the second clamp jig are moved in vertical to an end surface of the flexible substrate.

5. A method for manufacturing a semiconductor device comprising the steps of:
fixing part of a stack to a fixing mechanism, the stack including a transistor;
attaching a first adsorption jig, a second adsorption jig and a third adsorption jig to a first periphery of the stack, and attaching a fourth adsorption jig, a fifth adsorption jig and a sixth adsorption jig to a second periphery of the stack;
moving the first adsorption jig, the second adsorption jig and the third adsorption jig while supplying liquid to the stack so that a flexible substrate is partially separated from the stack;

fixing a first clamp jig to the flexible substrate at a position between the first adsorption jig and the second adsorption jig, and fixing a second clamp jig to the flexible substrate at a position between the second adsorption jig and the third adsorption jig; and moving the first adsorption jig, the second adsorption jig, the third adsorption jig, the first clamp jig and the second clamp jig so that the flexible substrate is separated from the stack.

6. The method for manufacturing a semiconductor device according to claim 5, further comprising a step of making a slit to the stack by laser processing before fixing the part of the stack to the fixing mechanism.

7. The method for manufacturing a semiconductor device according to claim 5, wherein the first adsorption jig, the second adsorption jig and the third adsorption jig are moved in a different direction from the first clamp jig and the second clamp jig.

8. The method for manufacturing a semiconductor device according to claim 7, wherein the first adsorption jig, the second adsorption jig and the third adsorption jig are moved upward, and the first clamp jig and the second clamp jig are moved in vertical to an end surface of the flexible substrate.

* * * * *